United States Patent
Lofy

(10) Patent No.: US 9,105,809 B2
(45) Date of Patent: Aug. 11, 2015

(54) SEGMENTED THERMOELECTRIC DEVICE

(75) Inventor: John Lofy, Claremont, CA (US)

(73) Assignee: Gentherm Incorporated, Northville, MI (US)

( * ) Notice: Subject to any disclaimer, the term of this patent is extended or adjusted under 35 U.S.C. 154(b) by 0 days.

(21) Appl. No.: 12/178,572

(22) Filed: Jul. 23, 2008

(65) Prior Publication Data

US 2009/0025770 A1  Jan. 29, 2009

Related U.S. Application Data

(60) Provisional application No. 60/951,432, filed on Jul. 23, 2007.

(51) Int. Cl.
*H01L 35/28* (2006.01)
*H01L 35/32* (2006.01)
*H01L 35/30* (2006.01)
*H01L 35/34* (2006.01)

(52) U.S. Cl.
CPC ............... *H01L 35/32* (2013.01); *H01L 35/30* (2013.01); *H01L 35/34* (2013.01)

(58) Field of Classification Search
CPC .......... H01L 35/10; H01L 35/30; H01L 35/34
USPC ......... 136/243, 258, 263, 264, 201, 230, 204; 257/292, 293
See application file for complete search history.

(56) References Cited

U.S. PATENT DOCUMENTS

| | | |
|---|---|---|
| 3,077,079 A | 2/1963 | Pietsch |
| 3,136,577 A | 6/1964 | Richard |
| 3,137,523 A | 6/1964 | Karner |
| 3,240,628 A | 3/1966 | Sonntag, Jr. |
| 3,325,312 A | 6/1967 | Sonntag, Jr. |
| 3,351,498 A | 11/1967 | Shinn et al. |
| 3,819,418 A | 6/1974 | Winkler et al. |
| 4,413,857 A | 11/1983 | Hayashi |

(Continued)

FOREIGN PATENT DOCUMENTS

| | | |
|---|---|---|
| DE | 10238552 | 8/2001 |
| DE | 10115242 | 10/2002 |

(Continued)

OTHER PUBLICATIONS

JP2005-079210A, Machine Translation, Morimoto, Mar. 2005.*

(Continued)

*Primary Examiner* — Devina Pillay
(74) *Attorney, Agent, or Firm* — Knobbe, Martens, Olson & Bear, LLP

(57) ABSTRACT

According to some embodiments, a thermoelectric system includes a plurality of thermoelectric elements forming a thermoelectric array, the thermoelectric elements having a cooling side and a heating side. The system further includes at least one heat exchanger on at least one of the cooling side and the heating side, the heat exchanger being in thermal communication with at least some of the thermoelectric elements. In addition, the system includes a substrate generally positioned between the thermoelectric elements and the heat exchange element. The substrate comprises an electrical isolation layer, a support element configured to receive the heat exchanger and a plurality of interconnecting tabs configured to place adjacent thermoelectric elements in electrical communication with one another.

15 Claims, 34 Drawing Sheets

(56) References Cited

U.S. PATENT DOCUMENTS

| | | | |
|---|---|---|---|
| 4,438,070 A | 3/1984 | Stephens et al. | |
| 4,459,428 A | 7/1984 | Chou | |
| 4,497,973 A * | 2/1985 | Heath et al. | 136/212 |
| 4,518,700 A | 5/1985 | Stephens | |
| 4,671,567 A | 6/1987 | Frobose | |
| 4,685,727 A | 8/1987 | Cremer et al. | |
| 4,704,320 A | 11/1987 | Mizunoya et al. | |
| 4,782,664 A | 11/1988 | Sterna et al. | |
| 4,802,929 A * | 2/1989 | Schock | 136/205 |
| 4,923,248 A | 5/1990 | Feher | |
| 4,947,648 A | 8/1990 | Harwell et al. | |
| 5,002,336 A | 3/1991 | Feher | |
| 5,022,462 A * | 6/1991 | Flint et al. | 165/80.4 |
| 5,077,709 A | 12/1991 | Feher | |
| 5,106,161 A | 4/1992 | Meiller | |
| 5,117,638 A | 6/1992 | Feher | |
| 5,279,128 A | 1/1994 | Tomatsu et al. | |
| 5,385,382 A | 1/1995 | Single, II et al. | |
| 5,456,081 A | 10/1995 | Chrysler et al. | |
| 5,584,183 A * | 12/1996 | Wright et al. | 62/3.7 |
| 5,597,200 A | 1/1997 | Gregory et al. | |
| 5,626,021 A | 5/1997 | Karunasiri et al. | |
| 5,637,921 A | 6/1997 | Burward-Hoy | |
| 5,724,818 A | 3/1998 | Iwata et al. | |
| 5,850,741 A | 12/1998 | Feher | |
| 5,865,031 A | 2/1999 | Itakura | |
| 5,887,304 A | 3/1999 | Von der Heyde | |
| 5,921,314 A | 7/1999 | Schuller et al. | |
| 5,924,766 A | 7/1999 | Esaki et al. | |
| 5,927,817 A | 7/1999 | Ekman et al. | |
| 6,003,950 A | 12/1999 | Larsson | |
| 6,019,420 A | 2/2000 | Faust et al. | |
| 6,048,024 A | 4/2000 | Wallman | |
| 6,053,163 A * | 4/2000 | Bass | 126/312 |
| 6,059,018 A | 5/2000 | Yoshinori et al. | |
| 6,062,641 A | 5/2000 | Suzuki et al. | |
| 6,079,485 A | 6/2000 | Esaki et al. | |
| 6,085,369 A | 7/2000 | Feher | |
| 6,094,919 A | 8/2000 | Bhatia | |
| 6,097,088 A | 8/2000 | Sakuragi | |
| 6,119,463 A | 9/2000 | Bell | |
| 6,127,619 A * | 10/2000 | Xi et al. | 136/203 |
| 6,145,925 A | 11/2000 | Eksin et al. | |
| 6,186,592 B1 | 2/2001 | Orizakis et al. | |
| 6,189,966 B1 | 2/2001 | Faust et al. | |
| 6,196,627 B1 | 3/2001 | Faust et al. | |
| 6,206,465 B1 | 3/2001 | Faust et al. | |
| 6,223,539 B1 | 5/2001 | Bell | |
| 6,263,530 B1 | 7/2001 | Feher | |
| 6,347,521 B1 | 2/2002 | Kadotani et al. | |
| 6,400,013 B1 * | 6/2002 | Tsuzaki et al. | 257/712 |
| 6,410,971 B1 * | 6/2002 | Otey | 257/467 |
| 6,509,704 B1 | 1/2003 | Brown | |
| 6,539,725 B2 | 4/2003 | Bell | |
| RE38,128 E | 6/2003 | Gallup et al. | |
| 6,574,967 B1 | 6/2003 | Park et al. | |
| 6,583,638 B2 | 6/2003 | Costello et al. | |
| 6,598,251 B2 | 7/2003 | Habboub et al. | |
| 6,598,405 B2 | 7/2003 | Bell | |
| 6,604,785 B2 | 8/2003 | Bargheer et al. | |
| 6,605,955 B1 | 8/2003 | Costello et al. | |
| 6,606,866 B2 | 8/2003 | Bell | |
| 6,619,044 B2 | 9/2003 | Batchelor et al. | |
| 6,619,736 B2 | 9/2003 | Stowe et al. | |
| 6,625,990 B2 | 9/2003 | Bell | |
| 6,626,488 B2 | 9/2003 | Pfahler | |
| 6,637,210 B2 | 10/2003 | Bell | |
| 6,644,735 B2 | 11/2003 | Bargheer et al. | |
| 6,672,076 B2 | 1/2004 | Bell | |
| 6,676,207 B2 | 1/2004 | Rauh et al. | |
| 6,700,052 B2 | 3/2004 | Bell | |
| 6,711,904 B1 | 3/2004 | Law et al. | |
| 6,761,399 B2 | 7/2004 | Bargheer et al. | |
| 6,786,541 B2 | 9/2004 | Haupt et al. | |
| 6,786,545 B2 | 9/2004 | Bargheer et al. | |
| 6,808,230 B2 | 10/2004 | Buss et al. | |
| 6,812,395 B2 | 11/2004 | Bell | |
| 6,815,814 B2 | 11/2004 | Chu et al. | |
| 6,817,191 B2 | 11/2004 | Watanabe | |
| 6,828,528 B2 | 12/2004 | Stowe et al. | |
| 6,841,957 B2 | 1/2005 | Brown | |
| 6,845,622 B2 | 1/2005 | Sauciuc et al. | |
| 6,855,880 B2 | 2/2005 | Feher | |
| 6,857,697 B2 | 2/2005 | Brennan et al. | |
| 6,893,086 B2 | 5/2005 | Bajic et al. | |
| 6,907,739 B2 | 6/2005 | Bell | |
| 6,954,944 B2 | 10/2005 | Feher | |
| 6,959,555 B2 | 11/2005 | Bell | |
| 6,976,734 B2 | 12/2005 | Stowe | |
| 7,040,710 B2 | 5/2006 | White et al. | |
| 7,070,232 B2 | 7/2006 | Minegishi et al. | |
| 7,084,502 B2 | 8/2006 | Bottner et al. | |
| 7,108,319 B2 | 9/2006 | Hartwich et al. | |
| 7,114,771 B2 | 10/2006 | Lofy et al. | |
| 7,124,593 B2 | 10/2006 | Feher | |
| 7,131,689 B2 | 11/2006 | Brennan et al. | |
| 7,147,279 B2 | 12/2006 | Bevan et al. | |
| 7,168,758 B2 | 1/2007 | Bevan et al. | |
| 7,178,344 B2 | 2/2007 | Bell | |
| 7,201,441 B2 | 4/2007 | Stoewe et al. | |
| 7,224,059 B2 | 5/2007 | Shimada et al. | |
| 7,231,772 B2 | 6/2007 | Bell | |
| 7,244,887 B2 | 7/2007 | Miley | |
| 7,246,496 B2 | 7/2007 | Goenka et al. | |
| 7,272,936 B2 | 9/2007 | Feher | |
| 7,273,981 B2 | 9/2007 | Bell | |
| 7,299,639 B2 | 11/2007 | Leija et al. | |
| 7,360,365 B2 | 4/2008 | Codecasa et al. | |
| 7,380,586 B2 | 6/2008 | Gawthrop | |
| 7,425,034 B2 | 9/2008 | Bajic et al. | |
| 7,426,835 B2 | 9/2008 | Bell et al. | |
| 7,462,028 B2 | 12/2008 | Cherala et al. | |
| 7,475,464 B2 | 1/2009 | Lofy et al. | |
| 7,480,950 B2 | 1/2009 | Feher | |
| 7,506,938 B2 | 3/2009 | Brennan et al. | |
| 7,587,901 B2 | 9/2009 | Petrovski | |
| 7,587,902 B2 | 9/2009 | Bell | |
| 7,591,507 B2 | 9/2009 | Giffin et al. | |
| 7,608,777 B2 | 10/2009 | Bell et al. | |
| 7,640,754 B2 | 1/2010 | Wolas | |
| 7,665,803 B2 | 2/2010 | Wolas | |
| 7,708,338 B2 | 5/2010 | Wolas | |
| RE41,765 E | 9/2010 | Gregory et al. | |
| 7,827,620 B2 | 11/2010 | Feher | |
| 7,827,805 B2 | 11/2010 | Comiskey et al. | |
| 7,862,113 B2 | 1/2011 | Knoll | |
| 7,866,017 B2 | 1/2011 | Knoll | |
| 7,877,827 B2 | 2/2011 | Marquette et al. | |
| 7,937,789 B2 | 5/2011 | Feher | |
| 7,963,594 B2 | 6/2011 | Wolas | |
| 7,966,835 B2 | 6/2011 | Petrovski | |
| 7,996,936 B2 | 8/2011 | Marquette et al. | |
| 8,065,763 B2 | 11/2011 | Brykalski et al. | |
| 8,104,295 B2 | 1/2012 | Lofy | |
| 8,143,554 B2 | 3/2012 | Lofy | |
| 8,181,290 B2 | 5/2012 | Brykalski et al. | |
| 8,191,187 B2 | 6/2012 | Brykalski et al. | |
| 8,222,511 B2 | 7/2012 | Lofy | |
| 8,256,236 B2 | 9/2012 | Lofy | |
| 8,332,975 B2 | 12/2012 | Brykalski et al. | |
| 8,402,579 B2 | 3/2013 | Marquette et al. | |
| 8,418,286 B2 | 4/2013 | Brykalski et al. | |
| 8,434,314 B2 | 5/2013 | Comiskey et al. | |
| 8,438,863 B2 | 5/2013 | Lofy | |
| RE44,272 E | 6/2013 | Bell | |
| 8,505,320 B2 | 8/2013 | Lofy | |
| 8,516,842 B2 | 8/2013 | Petrovski | |
| 8,539,624 B2 | 9/2013 | Terech et al. | |
| 8,575,518 B2 | 11/2013 | Walsh | |
| 8,621,687 B2 | 1/2014 | Brykalski et al. | |
| 8,732,874 B2 | 5/2014 | Brykalski et al. | |
| 8,782,830 B2 | 7/2014 | Brykalski et al. | |
| 8,893,329 B2 | 11/2014 | Petrovski | |
| 2003/0145380 A1 | 8/2003 | Schmid | |

(56) References Cited

U.S. PATENT DOCUMENTS

| | | |
|---|---|---|
| 2004/0090093 A1 | 5/2004 | Kamiya et al. |
| 2004/0238022 A1* | 12/2004 | Hiller et al. .............. 136/203 |
| 2004/0255364 A1 | 12/2004 | Feher |
| 2005/0056310 A1* | 3/2005 | Shikata et al. ............ 136/205 |
| 2005/0072165 A1* | 4/2005 | Bell .............................. 62/3.7 |
| 2005/0126184 A1* | 6/2005 | Cauchy ........................ 62/3.3 |
| 2005/0257532 A1 | 11/2005 | Ikeda et al. |
| 2005/0285438 A1 | 12/2005 | Ishima et al. |
| 2006/0005944 A1 | 1/2006 | Wang et al. |
| 2006/0053529 A1 | 3/2006 | Feher |
| 2006/0087160 A1 | 4/2006 | Dong et al. |
| 2006/0123799 A1* | 6/2006 | Tateyama et al. ............ 62/3.7 |
| 2006/0137099 A1 | 6/2006 | Feher |
| 2006/0137358 A1 | 6/2006 | Feher |
| 2006/0157102 A1* | 7/2006 | Nakajima et al. ........... 136/205 |
| 2006/0214480 A1 | 9/2006 | Terech |
| 2006/0225441 A1 | 10/2006 | Goenka et al. |
| 2006/0243317 A1 | 11/2006 | Venkatasubramanian |
| 2006/0273646 A1 | 12/2006 | Comiskey et al. |
| 2007/0017666 A1 | 1/2007 | Goenka et al. |
| 2007/0086757 A1 | 4/2007 | Feher |
| 2007/0163269 A1 | 7/2007 | Chung et al. |
| 2007/0200398 A1 | 8/2007 | Wolas et al. |
| 2007/0251016 A1 | 11/2007 | Feher |
| 2007/0262621 A1 | 11/2007 | Dong et al. |
| 2007/0277313 A1 | 12/2007 | Terech |
| 2008/0000025 A1 | 1/2008 | Feher |
| 2008/0023056 A1 | 1/2008 | Kambe et al. |
| 2008/0028768 A1 | 2/2008 | Goenka |
| 2008/0028769 A1 | 2/2008 | Goenka |
| 2008/0047598 A1 | 2/2008 | Lofy |
| 2008/0053108 A1 | 3/2008 | Wen |
| 2008/0078186 A1 | 4/2008 | Cao |
| 2008/0087316 A1 | 4/2008 | Inaba et al. |
| 2008/0164733 A1 | 7/2008 | Giffin et al. |
| 2008/0166224 A1 | 7/2008 | Giffin et al. |
| 2008/0173022 A1 | 7/2008 | Petrovski |
| 2008/0289677 A1 | 11/2008 | Bell et al. |
| 2008/0307796 A1 | 12/2008 | Bell et al. |
| 2009/0000031 A1 | 1/2009 | Feher |
| 2009/0000310 A1 | 1/2009 | Bell et al. |
| 2009/0025770 A1 | 1/2009 | Lofy |
| 2009/0026813 A1 | 1/2009 | Lofy |
| 2009/0033130 A1 | 2/2009 | Marquette et al. |
| 2009/0126110 A1 | 5/2009 | Feher |
| 2009/0178700 A1 | 7/2009 | Heremans et al. |
| 2009/0193814 A1 | 8/2009 | Lofy |
| 2009/0211619 A1 | 8/2009 | Sharp et al. |
| 2009/0218855 A1 | 9/2009 | Wolas |
| 2009/0235969 A1 | 9/2009 | Heremans et al. |
| 2009/0269584 A1 | 10/2009 | Bell et al. |
| 2010/0193498 A1 | 8/2010 | Walsh |
| 2011/0048033 A1 | 3/2011 | Comiskey et al. |
| 2011/0107514 A1 | 5/2011 | Brykalski et al. |
| 2011/0115635 A1 | 5/2011 | Petrovski et al. |
| 2011/0253340 A1 | 10/2011 | Petrovski |
| 2011/0271994 A1 | 11/2011 | Gilley |
| 2011/0296611 A1 | 12/2011 | Marquette et al. |
| 2012/0080911 A1 | 4/2012 | Brykalski et al. |
| 2012/0104000 A1 | 5/2012 | Lofy |
| 2012/0114512 A1 | 5/2012 | Lofy et al. |
| 2012/0131748 A1 | 5/2012 | Brykalski et al. |
| 2012/0261399 A1 | 10/2012 | Lofy |
| 2012/0319439 A1 | 12/2012 | Lofy |
| 2013/0086923 A1 | 4/2013 | Petrovski et al. |
| 2013/0097776 A1 | 4/2013 | Brykalski et al. |
| 2013/0097777 A1 | 4/2013 | Marquette et al. |
| 2013/0198954 A1 | 8/2013 | Brykalski et al. |
| 2013/0206852 A1 | 8/2013 | Brykalski et al. |
| 2013/0227783 A1 | 9/2013 | Brykalski et al. |
| 2013/0239592 A1 | 9/2013 | Lofy |
| 2013/0269106 A1 | 10/2013 | Brykalski et al. |
| 2014/0007594 A1 | 1/2014 | Lofy |
| 2014/0026320 A1 | 1/2014 | Marquette et al. |
| 2014/0062392 A1 | 3/2014 | Lofy et al. |
| 2014/0090829 A1 | 4/2014 | Petrovski |
| 2014/0130516 A1 | 5/2014 | Lofy |
| 2014/0131343 A1 | 5/2014 | Walsh |
| 2014/0237719 A1 | 8/2014 | Brykalski et al. |
| 2014/0250918 A1 | 9/2014 | Lofy |
| 2014/0260331 A1 | 9/2014 | Lofy et al. |
| 2014/0305625 A1 | 10/2014 | Petrovski |
| 2014/0310874 A1 | 10/2014 | Brykalski et al. |
| 2014/0338366 A1 | 11/2014 | Adldinger et al. |
| 2015/0013346 A1 | 1/2015 | Lofy |

FOREIGN PATENT DOCUMENTS

| | | | |
|---|---|---|---|
| GB | 874660 | 9/1961 | |
| JP | 10332883 | 12/1998 | |
| JP | 2003204087 | 7/2003 | |
| JP | 2005-079210 A * | 3/2005 | .............. H01L 35/30 |
| JP | 2005-333083 * | 12/2005 | .............. H01L 35/34 |
| WO | WO 98/07898 | 2/1998 | |
| WO | WO 02/11968 | 2/2002 | |
| WO | WO 03/051666 | 6/2003 | |

OTHER PUBLICATIONS

JP2005-333083, Machine Translation, Watanabe, Dec. 2005.*

Feher, Steve, Thermoelectric Air Conditioned Variable Temperature Seat (VTS) & Effect Upon Vehicle Occupant Comfort, Vehicle Energy Efficiency, and Vehicle Environment Compatibility, SAE Technical Paper, Apr. 1993, pp. 341-349.

Lofy, J. et al., Thermoelectrics for Environmental Control in Automobiles, Proceeding of Twenty-First International Conference on Thermoelectrics (ICT 2002), published 2002, pp. 471-476.

* cited by examiner

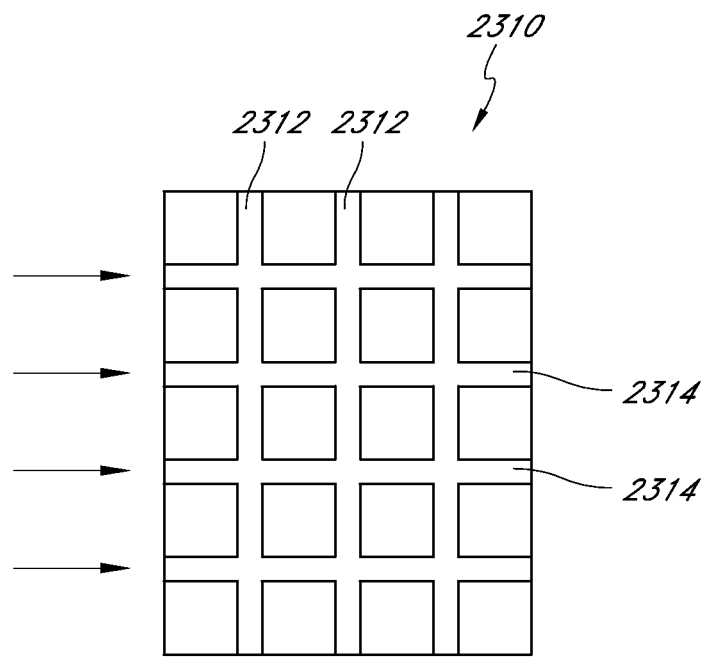
FIG. 23A
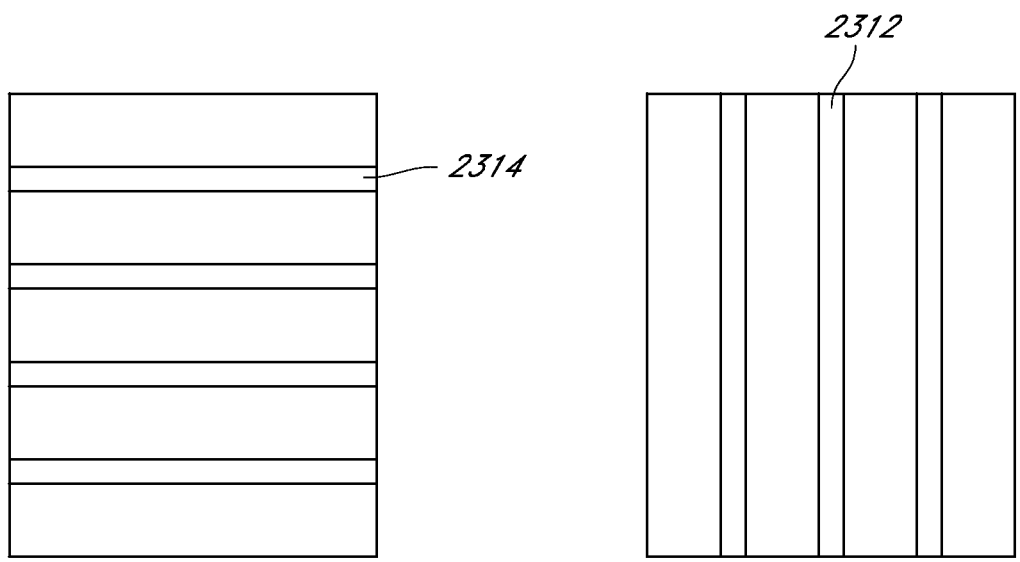
FIG. 23B
FIG. 23C

SEGMENTED THERMOELECTRIC DEVICE

CROSS REFERENCE TO RELATED APPLICATIONS

This application claims the priority benefit under 35 U.S.C. §119(e) of U.S. Provisional Application No. 60/951,432, filed Jul. 23, 2007, the entirety of which is hereby incorporated by reference herein.

BACKGROUND OF THE INVENTIONS

1. Field of the Inventions

The present application relates generally to thermoelectric devices, and more specifically, to improved thermoelectric devices configured to better accommodate expansion and contraction forces.

2. Description of the Related Art

A Peltier circuit is a type of a thermoelectric device that comprises two sides. When voltage is applied in one direction, one side creates heat while the other side absorbs heat. Switching polarity of the circuit creates the opposite effect. In a typical arrangement, the Peltier circuit comprises a closed circuit that includes dissimilar materials. As a DC voltage is applied to the closed circuit, a temperature change is produced at the junction of the dissimilar materials, and heat is either emitted or absorbed depending on the direction of current flow. The Peltier circuit can include several such junctions connected electrically in series. Typically, the junctions are sandwiched between two ceramic plates, which form the cold side and the hot side of the device. The cold side can be thermally coupled to an object to be cooled and the hot side can be thermally coupled to a heat sink which dissipates heat to the environment.

U.S. Patent Publication No. 2006/0130490, filed on Jan. 31, 2005, discloses, inter alia, a vehicle seat ventilation system that utilizes a thermoelectric device to provide conditioned (e.g., heated, cooled) air or other fluid to a vehicle seat for enhancing an occupant's comfort. Specifically, air can be passed over the cold and/or hot side of the Peltier circuit to heat and/or cool the air, which is then directed to one or more portions of the vehicle seat. Use of a Peltier circuit is particularly advantageous in such applications because Peltier circuits are relatively compact and permit a single device to provide heated and/or cooled air to the vehicle seat.

A general need remains to improve the efficiency, effectiveness and/or other aspects of such Peltier circuits.

SUMMARY

According to some embodiments, a thermoelectric system includes a plurality of thermoelectric elements forming a thermoelectric array, the thermoelectric elements having a cooling side and a heating side. The system further includes at least one heat exchanger on at least one of the cooling side and the heating side, the heat exchanger being in thermal communication with at least some of the thermoelectric elements. In addition, the system includes a substrate generally positioned between the thermoelectric elements and the heat exchange element. The substrate comprises an electrical isolation layer, a support element configured to receive the heat exchanger and a plurality of interconnecting tabs configured to place adjacent thermoelectric elements in electrical communication with one another. In some embodiments, the substrate comprises a plurality of expansion joints that are configured to alleviate thermal stress on the substrate when the thermoelectric elements are electrically energized. In one arrangement, the expansion joints comprise portions of the substrate that do not include a support element or an interconnecting tab. Further, according to some arrangements, the substrate comprises at least one bridge configured to connect adjacent support elements positioned on either side of the expansion joint.

According to some embodiments, the bridge is configured to be selectively removed once the substrate is secured to the heat exchanger and the thermoelectric elements. In other arrangements, the bridge is left on the substrate after assembly is complete. In one embodiment, the bridge is configured to hold the support elements in place during soldering or assembling and to accommodate thermal stress. In other arrangements, the electrical isolation layer comprises polyimide or ceramic. In another embodiment, the support element comprises copper.

According to some embodiments, the support element is segmented forming a plurality of separate support segments, a gap between said segments generally defining the expansion joint. In another arrangement, the heat exchanger is configured to extend across an expansion joint. In still other embodiments, the heat exchanger is configured to not extend across an expansion joint. In another embodiment, the system further includes a sealant positioned within at least one of the expansion joints, the sealant being configured to protect the thermoelectric elements.

According to some embodiments, a thermoelectric assembly includes a plurality of thermoelectric elements forming a thermoelectric array, the thermoelectric elements having a cooling side and a heating side. The assembly additionally includes a plurality of fins on at least one of the cooling side and the heating side, the fins being in thermal communication with at least some of the thermoelectric elements. Further, the assembly comprises a substrate generally positioned between the thermoelectric elements and the fins. The substrate includes an electrical isolation layer and a support element configured to receive the fins. According to some arrangements, the substrate comprises a plurality of expansion joints that are configured to reduce thermal stress on the substrate. In one embodiment, the expansion joints comprise portions of the substrate that do not include a support element. In yet another embodiment, the substrate comprises at least one interconnecting bridge configured to connect adjacent support elements positioned on either side of the expansion joint.

According to some arrangements, the bridge is configured to be selectively removed once the substrate is secured to the fins and the thermoelectric elements. In another embodiment, the bridges are adapted to remain attached to the substrate after the assembly has been completed. In one embodiment, the electrical isolation layer comprises polyimide.

According to some embodiments, a method of manufacturing a thermoelectric assembly includes attaching a plurality of thermoelectric elements to a substrate having at least one expansion joint, the substrate comprising an electrical isolation layer, at least one support element configured to receive heat exchangers, the support element comprising at least two support segments and at least one bridge connecting adjacent segments of the support element across the expansion joints. The method further includes attaching at least one heat exchanger to the substrate, wherein the bridges are configured to either remain on the substrate or be removed from the substrate after the substrate has been secured to the thermoelectric elements and the heat exchanger. In some arrangements, the method further comprises removing the bridges from the substrate when the substrate has been secured to the thermoelectric elements and the heat exchanger. In one embodiment, the method further comprises positioning the a housing around the assembly. The bridges are configured to ease assembly of the thermoelectric assembly comprising one or more expansion joints.

One aspect of the invention provides a thermoelectric system for use with at least one medium to be cooled or heated. The system comprises a plurality of thermoelectric elements forming a thermoelectric array with a cooling side and a heating side; at least one heat exchanger on at least the cooling and/or the heating side in thermal communication with at least one thermoelectric element; and a substrate or electrical isolation layer and one or more thermal conductive elements between the thermoelectric element and the heat exchanger. In one embodiment, at least a portion of the thermoelectric system does not comprise thermoelectric or semiconductor elements. Such a configuration can advantageously permit the thermoelectric system to bend or otherwise change shape in response to thermal expansion or other occurrences imposed on the system during operation.

The thermoelectric system in combination with a fluid transfer device is provided. The thermoelectric system in combination with a climate control system for a seat assembly is provided.

Another aspect of the invention provides a thermoelectric system for use with at least one medium to be cooled or heated. The system comprises a plurality of thermoelectric elements forming a thermoelectric array with a cooling side and a heating side; at least one heat exchanger on at least the cooling and/or the heating side in thermal communication with at least one thermoelectric element; a substrate between at least one thermoelectric element and the at least one heat exchanger; and a plurality of expansion joints provided in the substrate so as to form a plurality of segmented fin pads, wherein the plurality of expansion joints are configured to alleviate thermal stress on the substrate.

The thermoelectric system can further comprise a housing which is filled at least partially with stress absorbing pads. The stress absorbing pads may comprise Volara.

The stress absorbing pads can be disposed to the direction of heating side and cooling side inside the housing, but not to the direction of extension of the substrate.

The expansion joints can be bridged with a flimsy lateral bridging. The flimsy lateral bridging can be configured to hold the fin pads in place during soldering or assembling and to accommodate thermal stress.

In some embodiments, a thermoelectric device or system comprises a plurality of thermoelectric elements forming a thermoelectric array, the thermoelectric elements having a cooling side and a heating side, one or more heat exchange elements on at least the cooling and the heating side, the heat exchange element being in thermal communication with at least one thermoelectric element, a heat conductor element positioned between the thermoelectric element and the heat exchange element and an electrical isolation layer between the thermoelectric elements and the heat conductor element, a plurality of expansion joints provided in the heat conductor element. In one embodiment, the plurality of expansion joints are configured to alleviate thermal stress on the heat conductor element.

BRIEF DESCRIPTION OF THE DRAWINGS

These and other features, aspects and advantages of the present devices, systems and methods are described in detail below with reference to drawings of certain preferred embodiments, which are intended to illustrate, but not to limit, the present inventions. The drawings contain forty-seven (47) figures. It is to be understood that the attached drawings are for the purpose of illustrating concepts of the present inventions and may not be to scale.

FIG. 23A is a plan view of a thermoelectric device having segmentations according to one embodiment;

FIG. 23B is a plan view of a thermoelectric device having segmentations according to another embodiment;

FIG. 23C is a plan view of a thermoelectric device having segmentations according to yet another embodiment;

DETAILED DESCRIPTION OF THE PREFERRED EMBODIMENTS

Figure 1:
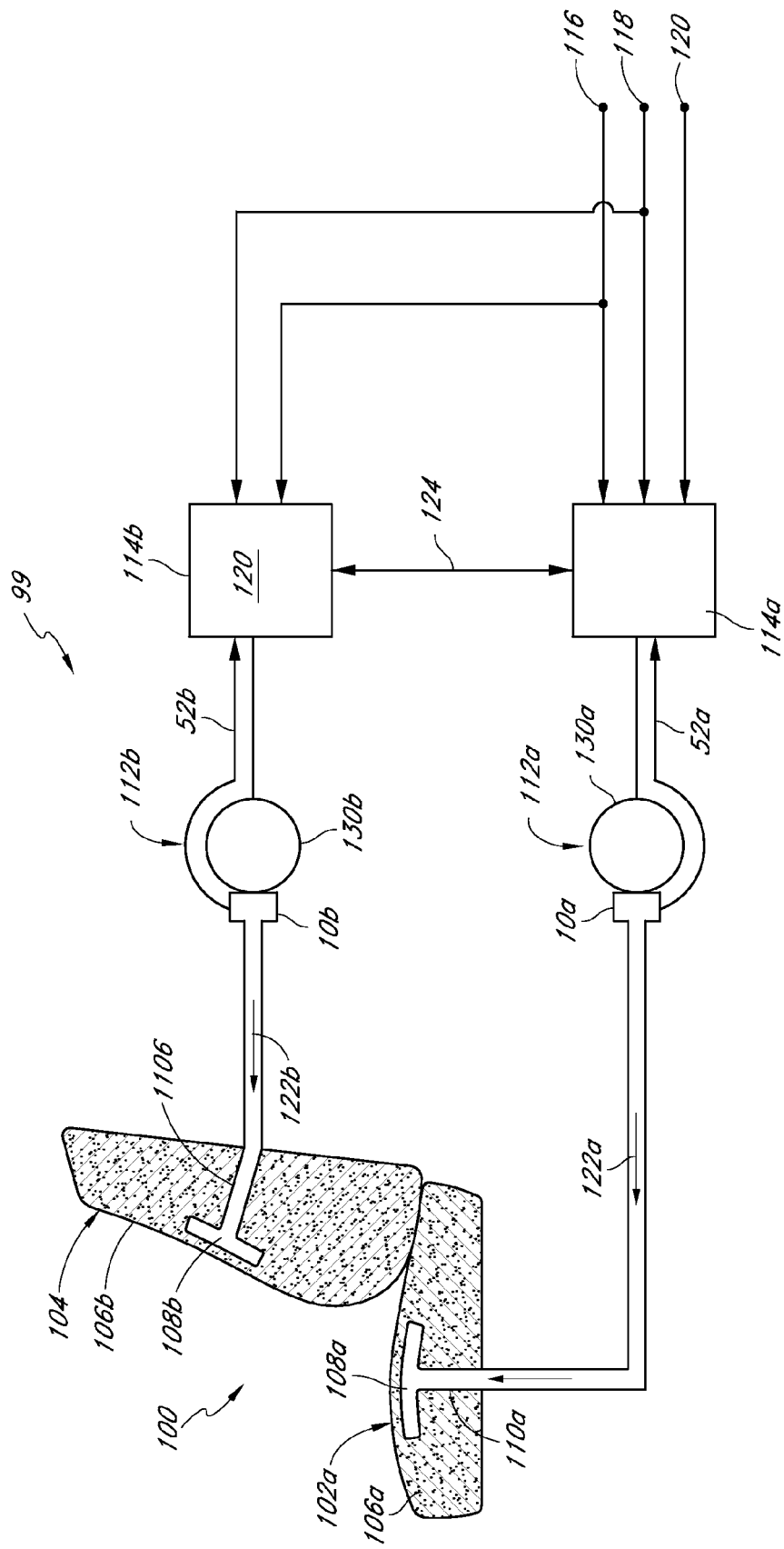
FIG. 1 is a schematic illustration of a climate controlled seating assembly that includes thermoelectric devices in accordance with one embodiment.

With reference to FIG. 1, a seat assembly 100 can comprise a climate control system 99. In the illustrated embodiment, the climate control system 99 comprises a pair of thermoelectric devices 10 that can help to selectively heat and/or cool air or other fluid delivered by the climate control system 99. As will be described herein, the thermoelectric devices can include various features and aspects that are configured such that the thermoelectric devices 10a, 10b can better accommodate expansion and contraction forces during use. Before describing the details of these features and aspects, the thermoelectric devices 10 will first be described in the context of the larger climate control system 99 of FIG. 1.

In FIG. 1, the seat assembly 100 is similar to a standard automotive seat. However, certain features and aspects of the thermoelectric devices 10, the climate control system 99 and/or seat assembly 100 illustrated and/or disclosed herein can also be used in a variety of other applications and environments. For example, some or all of the features or aspects of the thermoelectric devices 10, the climate control system 99 and/or the seat assembly 100 can be adapted for use in other vehicles, such as, for example, airplanes, wheel chairs, boats, trains and/or the like. Further, one or more of such features and aspects can be adapted for use in stationary environments, such as, for example, chairs, sofas, theater seats, beds, mattresses, other portions of beds, office seats, other seating assemblies that are used in places of business and/or residences and/or the like.

With continued reference to FIG. 1, a seat assembly 100 can comprise a seat portion 102 and a back portion 104. Further, the seat portion 102 and/or the back portion 104 can each comprise a cushion 106a, 106b and a plurality of channels 108a, 108b disposed within and/or extending through the cushions 106a, 106b. Each of the channels 108a, 108b can be placed in fluid communication with a climate control system 99 through one or more conduits 110a, 110b, inlets or other accessways. In the illustrated embodiment, each conduit 110a, 110b is in fluid communication with a separate climate control device 112a, 112b.

As shown in FIG. 1, the one or more channels 108a within the seat portion 102 of the seat assembly 100 are in fluid communication with a different climate control device 112a than the channels 108b of the back portion 104. However, in other embodiments, a single climate control device can be in fluid communication with all or some of the channels 108a, 108b of both the seat portion 102 and back portion 104. In yet other embodiments, the seat assembly 100 can be configured so that multiple climate control devices are in fluid communication with either the seat portion 102 and/or the back portion 104. The channels 108a, 108b and/or conduits 110a, 110b can include resistive heating elements (not shown).

In the illustrated embodiment, the climate control devices 112a, 112b comprise a thermoelectric device 10. Further, a climate controlled seat assembly 100 can include one or more fluid transfer devices 130a, 130b that are configured to move a volume of air or other fluid past a thermoelectric device 10. In some embodiments, the fluid transfer devices 130a, 130b are radial or axial fans. However, it will be appreciated that the fluid transfer devices 130a, 130b can be any other device configured to transfer or otherwise impart a force (e.g., positive, negative, etc.) on a fluid.

With continued reference to the schematic illustration of FIG. 1, a thermoelectric device 10 can be disposed between one or more fluid transfer devices 130a, 130b and the conduits 110a, 110b or other inlets. In other embodiments, however, a single fluid transfer device can be configured to provide air or other fluid to two or more thermoelectric devices 10. As described herein, a thermoelectric device 10 can be configured to selectively heat or cool a fluid (e.g., air) delivered to the seat and/or back portions 102, 104 by a fluid transfer device 130a, 130b.

In addition, one or more of the fluid transfer devices 130a, 130b can be configured to transfer air or other fluid to the corresponding channels 108a, 108b via one or more thermoelectric devices 10. Accordingly, the climate control devices 112a, 112b can be configured to selectively supply heated or cooled air 122a, 122b to a seat assembly 100. Further, one or more fluid transfer devices 130a, 130b of the climate control system 99 can be configured to pull air through the conduits 110a, 110b (from the exterior of the seat assembly 100 towards the fluid transfer devices 130a, 130b. This can be accomplished by operating the fluid transfer devices 130a, 130b under a vacuum or negative pressure mode.

Figure 2:
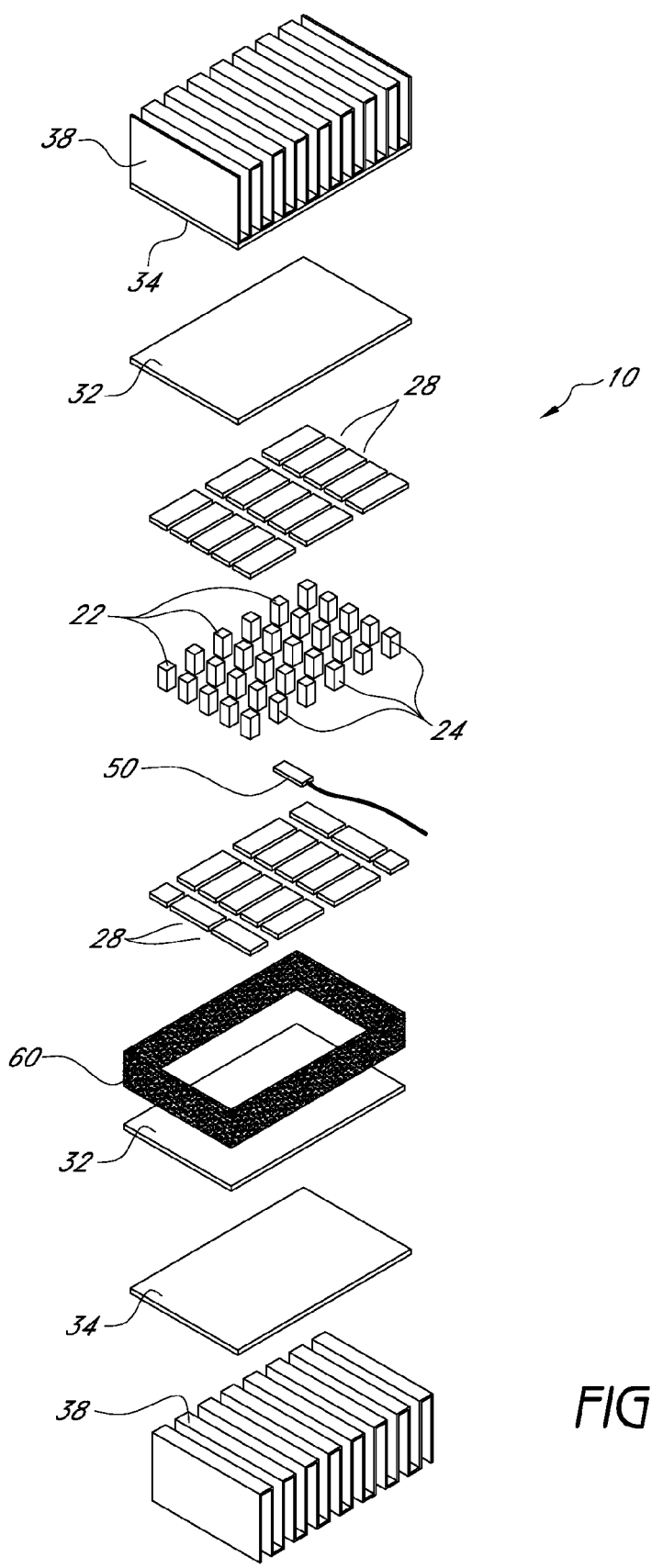
FIG. 2 is an exploded perspective view of one embodiment of a thermoelectric device.

A thermoelectric device 10 can include one or more heat transfer members or portions (not shown in FIG. 1), such as, for example, fins. As illustrated in FIG. 2 and discussed further herein, heat transfer members 38 (e.g., fins) of a thermoelectric device 10 can be configured to be a main heat exchanger and/or and a waste heat exchanger. In some embodiments, these fins or other heat transfer members 38 are shaped, sized, positioned and/or otherwise configured to transfer heat from or to a volume of air or other fluid being transferred by a fluid transfer device 130a, 130b. Depending on the exact mode of operation, heat can be transferred from the passing fluid (e.g., air) to the heat transfer members (e.g., fins). Alternatively, heat can be transferred from the heat transfer members (e.g., fins) to the passing fluid (e.g., air).

With continued reference to the embodiment schematically illustrated in FIG. 1, climate control devices 112a, 112b can be controlled and/or operatively connected by one or more control devices 114a, 114b. The control devices 114a, 114b can be configured to receive signals from one or more input sources 116, 118, 120. In the illustrated embodiment, three input sources are shown. However, it will be appreciated that in other embodiments a climate control system 99 can comprise more or fewer than three input sources. The control devices 114a, 114b can be operatively connected with each other through an information connection 124. The electronic control devices 114a, 114b can be configured to change the operating state of the climate control devices 112a, 112b in response to a control signal or setting. For example, the electronic control devices 114a, 114b can alter the speed at which fluid is transferred by the fluid transfer devices 130a, 130b or the operating state of the thermoelectric devices 10 to heat or cool the fluid.

Further, in some embodiments, control devices can be configured to control both the thermoelectric devices and the fluid transfer devices (e.g., blowers, fans, etc.) of a seat assembly. In seat assemblies comprising more than one thermoelectric device or fluid transfer device, a control device can be configured to regulate some or all of the thermoelectric devices and/or fluid transfer devices, as desired or required by a particular system. In yet other embodiments, a control device can be adapted to control two or more climate controlled seats and/or other climate controlled systems (e.g., cup holders, etc.) in an automobile, other vehicle or other environment.

As illustrated in the exploded perspective view of FIG. 2, the thermoelectric device 10 can comprise one or more sensors 50. In some embodiments, such sensors 50, which can be disposed within a thermoelectric device 10, can be configured to communicate with one or more of the control devices 114a, 114b (FIG. 1). In the illustrated embodiment, the sensor 50 is configured to communicate with the control devices 114a, 114b and/or other device through a hardwire connection 52a, 52b. However, it will be appreciated that the sensor 50 can be configured to communicate with one or more of the control devices 114a, 114b and/or other device using a wireless connection.

In some embodiments, the sensor 50 of a thermoelectric device 10, 10a, 10b permit one or more of the control devices 114a, 114b to accurately determine and/or regulate the operating temperature of the climate control devices 112a, 112b. The control devices 114a, 114b can adjust the operation of the climate control devices 112a, 112b based, at least in part, on information provided by the sensor 50. For example, the control devices 114a, 114b can change the direction and/or strength of current in the thermoelectric devices 10a, 10b, change the volumetric output of a fluid transfer device 130a, 130b, shut down the devices 10a, 10b if there is a malfunction and/or the like.

Various components of the climate controlled seat assembly are described herein as being "connected," "operatively connected" or otherwise attached to a control unit. It should be appreciated that these are broad terms and may include physical connections (e.g., electrical wires, hardwired circuits, etc.) and non-physical connections (e.g., wireless, radio frequency, infrared signals, RFID, etc.). In addition, these connections can include both direct connections and indirect connections (e.g., through additional or intermediate devices).

Figure 3:
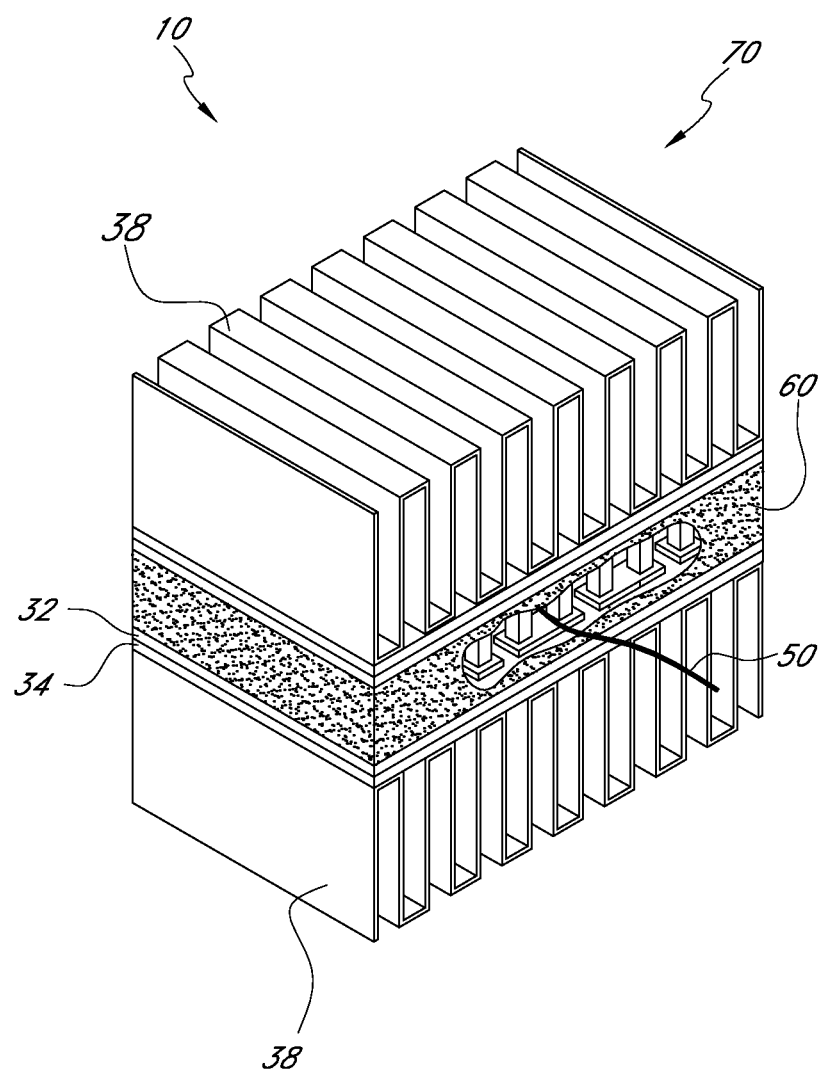
FIG. 3 is a side perspective view of the assembled thermoelectric device of FIG. 2.
Figure 4:
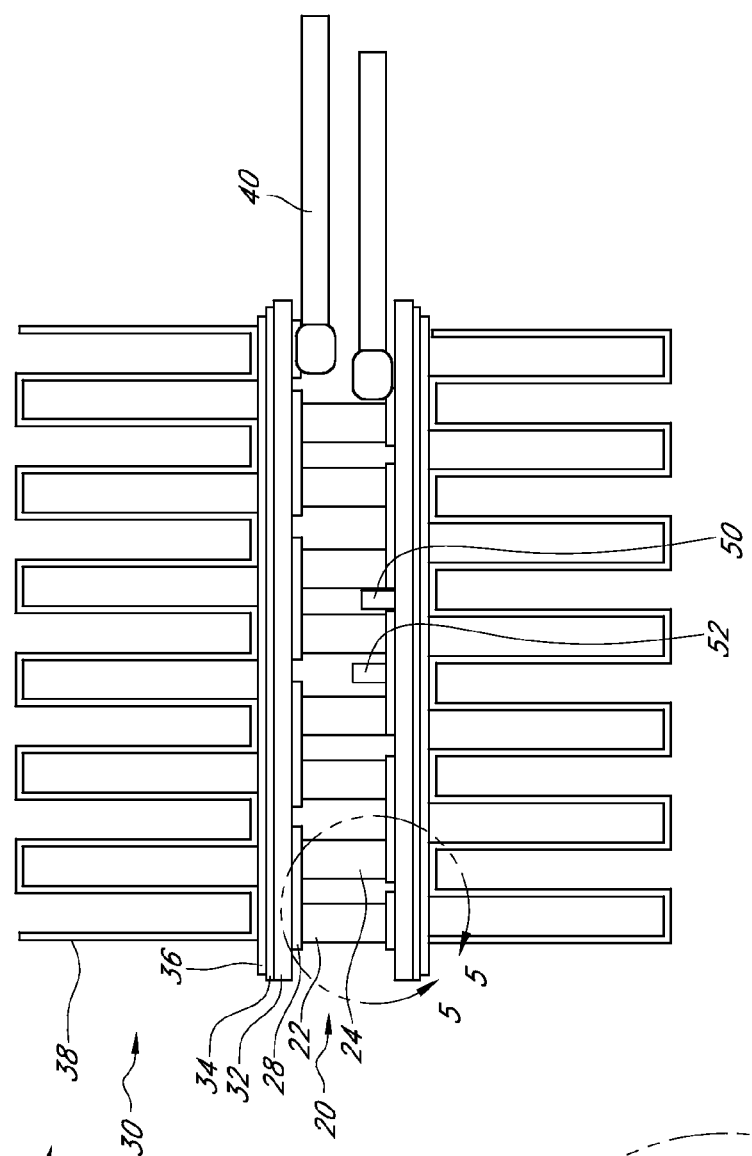
FIG. 4 is a side view of a thermoelectric device according to one embodiment.
Figure 5:
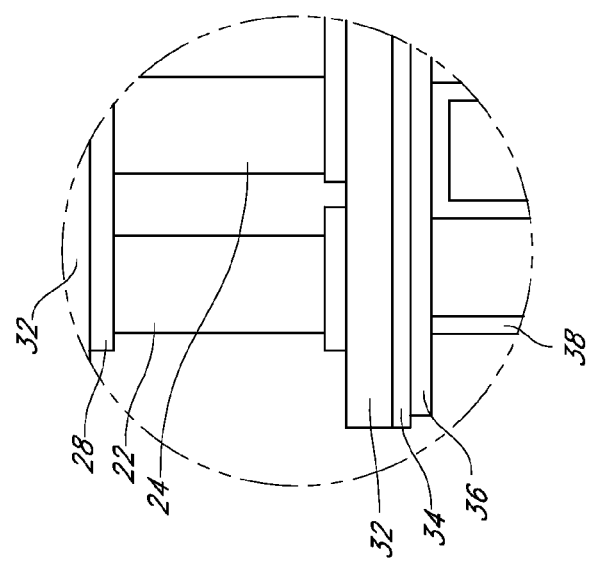
FIG. 5 is a detailed view of a portion of the thermoelectric device illustrated in FIG. 4.

FIGS. 2 through 5 illustrate different views and portions of one embodiment of a thermoelectric device 10. FIG. 2 is an exploded view of the thermoelectric device 10 with its various components separated for ease of inspection. Further, FIG. 3 illustrates a perspective view of the assembled thermoelectric device 10 of FIG. 2. FIG. 4 is a side view of the thermoelectric device 10 of FIG. 2 with certain portions removed. In addition, FIG. 5 is an enlarged view of a portion of the thermoelectric device depicted in FIG. 4.

With initial reference to FIGS. 2 and 3, the thermoelectric device 10 can include a plurality of dissimilar conductive elements 22, 24. It will be appreciated that such conductive elements 22, 24 can be referred to by one or more other terms, such as, for example, semiconductor elements, conductive pellets, pellets, Peltier elements or pellets and/or the like. As discussed in greater detail herein, pairs of dissimilar conductive elements 22, 24 can be coupled together in series by a plurality of tabs, junctions or joining elements 28 situated on both sides of the conductive elements 22, 24. In some embodiments, as illustrated in FIG. 2, these tabs 28 are positioned between a pair of opposing substrates 32. In the illustrated embodiment, each substrate 32 is thermally coupled to one or more heat transfer members 38 (e.g., fins) through a thermal conductive member 34 (e.g., polyimide layer, ceramic, etc.). As discussed, one or more sensors 50 can be positioned between the opposing substrates 32. Further, an optional seal 60 or similar member can be provided between the opposing substrates 32 to protect the conductive elements 22, 24, the tabs 28, the sensor 50 and/or any other components positioned within an interior portion of the thermoelectric device 10 between the substrates 32.

FIGS. 4 and 5 are side views of the thermoelectric device 10 illustrated in FIGS. 2 and 4 with the seal 60 omitted to allow inspection of its interior components, including the conductive elements 22, 24 or pellets, the conductive tabs 28 and the substrates 32. The conductive elements 22, 24 can comprise alternating N-type and P-type semiconductor elements. In one embodiment, the N-type semiconductor elements 22 and P-type semiconductor elements 24 can comprise bismuth-tellurium alloy ($Bi_2Te_3$). However, in other embodiments, the conductive elements 22, 24 can comprise one or more other types of materials, either in lieu of or in addition to the $Bi_2Te_3$. For example, the conductive elements 22, 24 can include other metal (e.g., doped, non-doped, etc.) or non-metal materials.

In some embodiments, at least a portion of the ends of each of the semiconductor elements 22, 24 can be coated with a diffusion barrier (not shown). The diffusion barrier can help prevent or inhibit the flow of electrons out of the respective semiconductor elements 22, 24. The diffusion barrier can comprise any of a number of materials, such as, for example, nickel, titanium/tungsten alloy, molybdenum and/or the like.

As illustrated in FIG. 4, pairs of dissimilar semiconductor elements 22, 24 can be coupled in series at their tops and bottoms with the conductive tabs 28 and/or other joining elements. In some embodiments, each conductive tab 28 is coupled to only one N-type semiconductor element 22 and one P-type semiconductor element 24. In addition, the upper and lower conductive tabs 28 are advantageously configured so that the semiconductor elements 22, 24 are disposed in an alternating series. Thus, the semiconductor elements 22, 24 can be electrically connected in series with each other.

With continued reference to FIG. 4, an N-type semiconductor element 22 can be coupled at its top to a first conductive tab 28 or other joining member. The conductive tab 28 can also be coupled to a P-type semiconductor element 24 (e.g., a P-type element 24 can be situated to the right of an N-type semiconductor element 22). At the bottom of a first N-type semiconductor element 22, a second conductive tab 28 or other joining member can be coupled to a N-type semiconductor element 22 and can be coupled to another P-type semiconductor element 24 (e.g., a conductive element 24 positioned to the left of a N-type thermoelectric element 22).

As used herein, the term "substrate" is a broad term and may include: only a thermal conductive layer or member (e.g., polyimide, ceramic, etc.); a thermal conductive member in combination with the conductive tabs 28; the thermal conductive member in combination with the fins support pads (e.g., copper or other member support member positioned along the opposite side of the pellets) and/or the conductive tabs 28. In some of the embodiments illustrated herein, one or more components or layers of a substrate may have been omitted for clarity and/or simplicity. In some embodiments, the substrate includes polyimide, ceramic and/or another thermally conductive and electrically non-conductive material. Copper or other metal layers may be included on one or both sides of the thermally conductive layer. In some embodiments, portions of the copper layer or other metal may be removed by etching and/or by any other means, as desired or required. For example, the substrate may be etched to only include copper in locations where the pellets will be joined and/or where the fins or other heat exchanger will connect.

In some embodiments, the conductive tabs 28 or other joining members can comprise a plurality of discrete elements coupled to the substrate 32 and/or an intermediate member. In other embodiments, the tabs 28 can be formed by tracing or otherwise forming a layer of conductive material on and/or within the substrate 32 and/or an intermediate element. As discussed, one or more sensors 50 can be disposed on and/or between the substrates 32 that are situated between the semiconductor elements 22, 24.

In addition, as illustrated in FIGS. 2 through 5, to facilitate in transferring heat from or to a thermoelectric device 10, a thermoelectric device can comprise heat transfer members 38 (e.g., fins) on its top and/or bottom sides. It should be appreciated that the thermoelectric device 10 can operate without one or more heat transfer members 38. However, the presence of such heat transfer members 38 can help increase the efficiency of heat transfer from the thermoelectric device 10 to the ambient atmosphere and/or a fluid (e.g., air) which passes relative to the thermoelectric device 10.

With continued reference to FIGS. 4 and 5, an electrically-conducting solder (not shown) can be used to mount the N-type semiconductor elements 22 and P-type semiconductor elements 24 to of the conductive tabs 28 of the substrate and/or other joining members. In some embodiments, the conducting solder can comprise tin, antimony and/or mixtures containing both. However, other metals or non-metals can be used, either in lieu of or in addition to tin and/or antimony. For example, in some embodiments, bismuth can also be alloyed with tin to create the solder. In yet other embodiments, other methods of attaching or affixing the semiconductor elements 22, 24 to the conductive tabs 28 and/or other joining member can be used, provided the desired electrical connections are permitted between the semiconductor elements 22, 24 and the conductive tabs 28. For instance, the conductive tabs 28 can be mounted to a substrate 32 using adhesives, welds and/or other attachment methods or devices.

The substrates 32 can be configured to provide electrical insulation while simultaneously providing for heat conduction. In some embodiments, the substrates 32 can comprise polyimide, ceramic materials, such as, for example, alumina (ceramic), silicon, epoxy and/or the like. However, one or more other types of materials can be used either in lieu of or in addition to the materials listed above. Regardless of their exact composition, the substrates 32 are preferably of sufficient rigidity and strength to generally maintain the shape of the thermoelectric device 10. However, it will be appreciated that in other embodiments, flexible or semi-flexible substrates can be used. In the illustrated embodiment, the substrate or other insulating layer or substrate 32 is shown having a relatively large thickness, especially when compared to adjacent layers. However, it will be appreciated that the relative thickness of the electrical insulating layer 32 can be larger or smaller than illustrated and discussed herein. For example, in some embodiments, the electrical insulating layer 32 comprises a relatively thin polyimide or ceramic layer.

In addition, for simplicity and clarity, an electrical insulating layer 32 may not be illustrated in the some of the embodiments depicted (FIGS. 1-35) and discussed herein. However, it will be appreciated that in order to provide the desired electrical isolation between the adjacent electrical conductor pads or interconnects and the heat conductor element (e.g., fin pads), one or more electrical insulating layers 32 can be included. Further, as discussed, the heat conductor elements, the electrical conductor pads and/or other components can be included in a single unitary structure with the electrical insulating layer.

In some embodiments, thermoelectric devices 10 can be constructed in various shapes and can have the ability to bend from one shape to another when flexible or semi-flexible substrates are used. As discussed, the substrates 32 can act as an electrical insulator. In some embodiments, the thickness of a substrate can be between 50 and 500 micrometers. However, in alternatively embodiments, the substrate thickness can be smaller than 50 micrometers or thicker than 500 micrometers.

In the embodiment depicted in FIGS. 2 through 5, the substrates 32 are sufficiently large to completely cover the semiconductor elements 22, 24 and conductive tabs 28. The conductive tabs 28 can be coupled to the electrically-insulating substrate 32 through solder, epoxy and/or any attachment method, device or mechanism.

With continued reference to FIGS. 4 and 5, a thermal conductive member or layer 34 can be disposed between the substrate 32 and the heat transfer member 38 (e.g., fins). Accordingly, in the illustrated embodiment, the heat or thermal conductive layer or element 34 can be disposed on the outside of each of the substrates 32. In one embodiment, the thermal conductive layer 34 can be a plate composed of copper and/or another material that has desirable thermal conductivity properties.

In some embodiments, the thickness of the heat transfer layer 34 can be between 10 and 400 micrometers. However, thinner or thicker layers can be used. The heat transfer member 38 can be coupled to one or more adjacent layers by a layer of heat-conducting solder 36 or any other attachment device or method. In the illustrated embodiment, the heat transfer member 38 comprises one or more materials having high thermal conductivity (e.g., copper, beryllium, etc.). As shown, to further enhance heat transfer, the heat transfer member 38 can be shaped into a plurality of fins or some other folded design. It will be appreciated that other materials or shapes can be used, such as, for example, copper alloys, other high heat transfer materials, circular members and/or the like. In addition, the heat transfer between the heat transfer member 38 and the surrounding environment can be enhanced by providing a blower, fan or other fluid transfer device 130a, 130b (FIG. 1) to move air or other fluid over and/or through the heat transfer member 38. For additional details regarding heat transfer members, please see, inter alia, U.S. patent application Ser. No. 12/049,120, titled AIR WARMER and filed Mar. 14, 2008, the entirety of which is incorporated by reference herein.

When a current is passed through the N-type semiconductor elements 22 in series with the P-type semiconductor elements 24, tabs or junctions 28 on one side of the semiconductor elements 22, 24 are heated, while tabs or junctions 28 on the opposite side of the thermoelectric elements 22, 24 are cooled. That is, when a voltage is applied in one direction in series through the semiconductor elements 22, 24, alternating junctions 28 of the N-type semiconductor elements 22 and P-type semiconductor elements 24 will heat and cool, respectively.

With continued reference to FIG. 4, because the position of the junctions or terminals 28 of the semiconductor elements 22, 24 alternates between the top and bottom of the device 10, when a voltage is applied in one direction through the semiconductor elements 22, 24, the top of the thermoelectric device 10 heats and the bottom of the thermoelectric device 10 cools. When the direction of the current is reversed, the top of the thermoelectric device 10 is cooled and the bottom is heated. Current can be applied to the device 10 through electrical connectors 40, which, as illustrated, can be electrically coupled to the junctions 28.

As discussed, one or more sensors 50 can be disposed within a thermoelectric device 10 (e.g., between the semiconductor elements 22, 24). In some embodiments, a sensor 50 can be configured to determine any of a number of states of operation of the thermoelectric device 10. For example, in the embodiment illustrated in FIG. 4, the sensor 50 can comprise a temperature sensor, such as a thermistor. As an example, a thermistor with an internal resistance of about 1000Ω can be used. However, thermistors having greater or lesser resistances can also be used. Alternatively, one or more other types of sensors that are capable of detecting different operating states of the thermoelectric device 10 can also be used, such as, for example, thermocouples, resistance thermometers and/or the like.

In FIG. 4, the electrical connectors 40 can form the terminals for supply of the electrical current.

Thermoelectric devices or modules can comprise a ceramic plate on top and bottom and thermoelectric pellets therebetween. According to some embodiments, during operation, a temperature differential generated between the top and bottom substrates or plates can exist. The exact amount of such a temperature differential can depend on one or more factors. However, in some arrangements, this temperature differential can be as high as 70 degrees Celsius, especially if the cooling load of the device is relatively low. In other embodiments, the temperature range can be higher or lower than 70 degrees Celsius, as desired or required by a particular application.

The temperature difference between opposing sides of a thermoelectric device can causes the hot side ceramic to expand and the cold side to contract, resulting in thermally induced stresses on the conductive junctions 28 where they attach to the adjacent ceramic substrates 32 and/or the semiconductor elements 22, 24. These stresses can generate fatigue, stresses, strains, failure and/or other types of damage on one or more portions of a thermoelectric device.

The extent to which the substrate 32 expands and/or contracts due to thermally induced stresses can be influenced by one or more factors. For example, in some embodiments, the extent of expansion and/or contraction can depend of coefficient of thermal expansion (COTE) of the substrate 32, the characteristic length of the substrate 32 and/or the operational temperature differential of the substrate 32. One or more other factors can also influence the expansion and/or contraction of the substrate 32 and/or other portions of a thermoelectric device.

In some embodiments, one or more of the substrates used in a thermoelectric device can be broken up into a plurality of smaller substrate sections. This can help reduce the thermal stresses exerted upon the substrate and/or other portions of the thermoelectric device. Consequently, the shape of the thermoelectric device can be permitted to advantageously change. Accordingly, any structure or other member surrounding the thermoelectric device can be configured to accommodate the resulting curvature changes in the thermoelectric device.

In addition, a thermoelectric device can comprise one or more other modifications and/or features to help reduce the thermal stresses applied to the substrate, either in lieu of or in addition to providing a segmented substrate. For example, in some embodiments, the heat transfer members (e.g., fins) are positioned, spaced, sized, shaped and/or otherwise configured to reduce the thermal stress applied to the adjacent substrate.

Figure 6A:
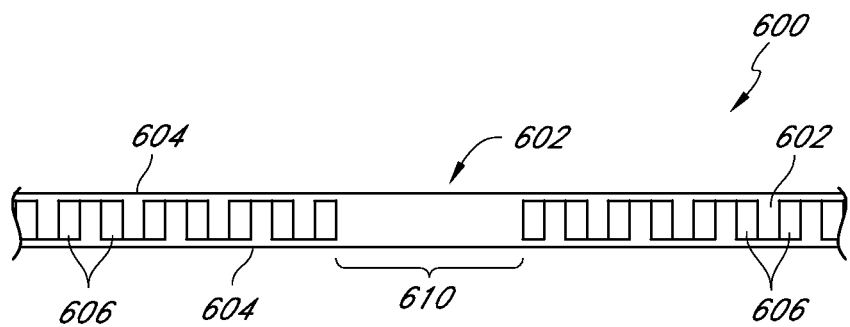
FIG. 6A is a partial cross-sectional view of a thermoelectric device comprising a stress relief joint or portion according to one embodiment.

With reference to the embodiment illustrated in FIG. 6A, a thermoelectric device 600 can include one or more stress relief joints 602 or similar members or features that can help reduce the thermal stress along the substrate (e.g., polyimide layer or other electrical isolation layer 604, the fin pads, pellet interconnects, etc.). The extent and/or shape of the curvature or bending of the thermoelectric device 600 depends, at least in part, on the thermal expansion and contraction occurring on opposite sides of the device 600. For example, when current is passed through the device 600, the top surface of the device expands because it is heated, and the bottom contracts or stays approximately the same length because it is cooled. It will be appreciated that the thermoelectric device 600 may have one or more other components, such as, for example, a thermal conductive layer or member (e.g., fin pad), a heat transfer member (e.g., fins) and/or the like. However, for clarity, other components are not illustrated in the depicted embodiment.

With continued reference to FIG. 6A, the stress relief joint 602 comprises a section 610 of the device 600 that does not include semiconductor elements 606. In the illustrated embodiment, such a section 610 is included toward the middle of the device 600. However, in other embodiments, such joints 602 or sections 610 can be included in one or more other portions of the thermoelectric device 600. Further, a thermoelectric device 600 can comprise two or more joints 602 or sections 610.

In FIG. 6A, the thermoelectric device 600 has not yet been activated to produce "hot" and "cold" sides. Accordingly, the device 600 has not been subjected to the resulting thermal stresses resulting from the temperature variation on opposite sides of the device 600.

Figure 6B:
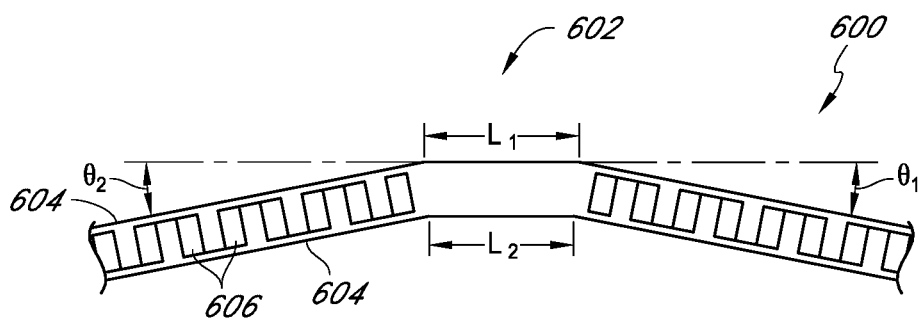
FIG. 6B is a partial cross-sectional view of a thermoelectric device comprising a stress relief joint or portion according to another embodiment.

FIG. 6B illustrates one embodiment of the thermoelectric device of FIG. 6A that has changed shape due to thermal expansion/contraction. As shown, the thermoelectric device 600 is configured so that, when activated, its "hot" side is at the top and its "cold" side is at the bottom. As a result of such a temperature differential, the thermal conductive members (not shown) and/or other metallic or temperature-sensitive components of the thermoelectric device 600 can expand and/or contract. For example, in FIG. 6B, the "hot" side of the device 600 has expanded and the "cold" side has contracted. Consequently, the shape of the thermoelectric device 600 has become generally bowed or bent. In the illustrated embodiment, the length ($L_1$) of the upper ("hot") side of the device 600 that does not comprise semiconductor elements 606 is generally longer than the length ($L_2$) of the lower ("colder") side of the device 600 that does not comprise semiconductor elements 606. It will be appreciated that the length of $L_1$ and $L_2$, as well as the difference between $L_1$ and $L_2$, can vary. Further, if the current through the thermoelectric device 600 is reversed, the "hot" and "cold" sides will reverse, and the device 600 may bend in the opposite direction. The absence of semiconductor elements 606 or pellets in the area of the joint 602 permits the thermoelectric device to bend or otherwise change shape easier than otherwise would be possible.

Figure 6C:
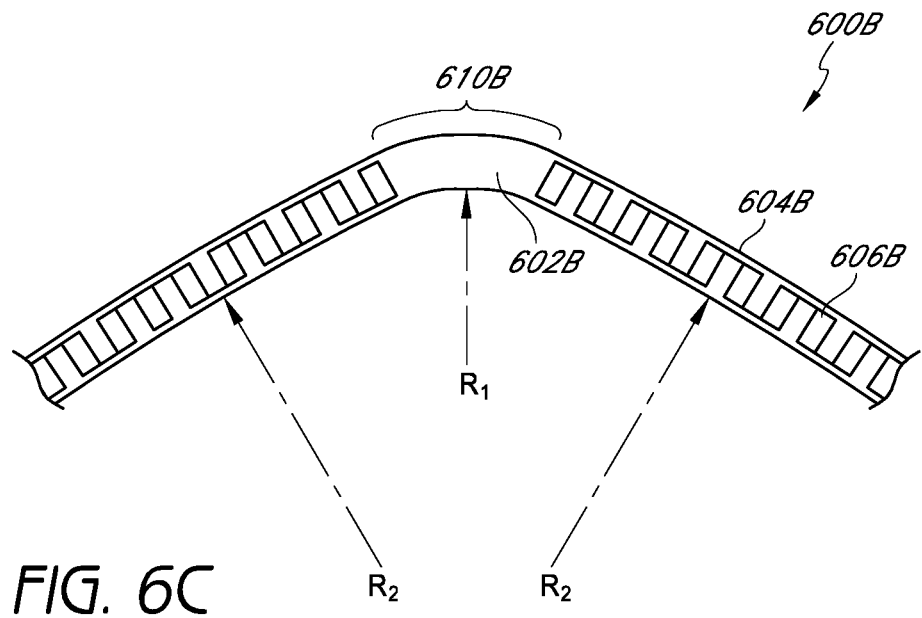
FIG. 6C is a cross-sectional view of another embodiment of a thermoelectric device similar to those illustrated in FIGS. 6A and 6B.

With continued reference to FIG. 6B, each of the portions of the thermoelectric device 600 comprising semiconductor elements can remain relatively straight. However, in other embodiments, as illustrated in FIG. 6C and discussed herein, these portions can bow, bend or otherwise change shape when subjected to a temperature gradient. In FIG. 6B, the portions of the thermoelectric device 600 situated on either side of the stress relief joint 602 can bend relative to the joint 602 by an angle $\theta_1$, $\theta_2$. This angle $\theta_1$, $\theta_2$ can vary depending on one or more factors, such as, for example, the size, thickness, dimension, shape, materials of construction and/or other characteristics of the various components of the device 600, the temperature differential between the "hot" and "cold" sides and/or the like. In addition, depending on the location, size, spacing and/or other details of the joints 602, the angles $\theta_1$, $\theta_2$ can even vary from one another.

FIG. 6C illustrates another embodiment of a thermoelectric device 600B having a stress relief joint 602B. As with the embodiment illustrated in FIGS. 6A and 6B, the depicted device 600B comprises a portion that does not include semiconductor elements 606B. Thus, this portion forms the stress relief joint 602B, as it permits the device 600B to respond to thermal stresses by bending or otherwise changing shape.

As discussed, a thermoelectric device having such a joint 602B can bend or change shape in one or more various manners. For example, in FIG. 6C, the thermoelectric device 600B assumes a more circular shape than the embodiment of FIG. 6B. As shown, the joint 602B includes a generally different curvature than the adjacent portions. For example, in FIG. 6C, the radius ($R_1$) of the middle section 610B is smaller than the radius ($R_2$) of the adjacent sections. Consequently, the curvature ($1/R_1$) of the middle section 610B is greater than the curvature ($1/R_2$) of the portions on either side of it.

With continued reference to the embodiment illustrated in FIG. 6C, the device 600B does not include semiconductor elements 606B in the vicinity of the stress relief joint 602B (e.g., the section 610B can have a greater curvature than the adjacent portions of the device 600B when heated and/or cooled). This can help provide a targeted area in which device can preferentially bend in response to thermal expansion and/or contraction to reduce the thermal stresses in the adjacent areas that comprise semiconductor elements 606B. Alternatively, the device 600B can include fewer semiconductor elements 606B in the vicinity of a stress relief joint 602B than in adjacent areas (i.e., the density of the semiconductor elements 606B can be reduced in the area of the joint 602B). In yet other embodiments, a thermal conductive element or layer, a substrate and/or other components of a thermoelectric device can include a different type of stress relief joint 602B than the ones illustrated and discussed herein, either in lieu of or in addition to a higher curvature section. Although the illustrated embodiments include only a single stress relief joint 602B, it will be appreciated that the device can comprise two or more stress relief joints 602B, as desired or required by a particular application.

Figure 7:
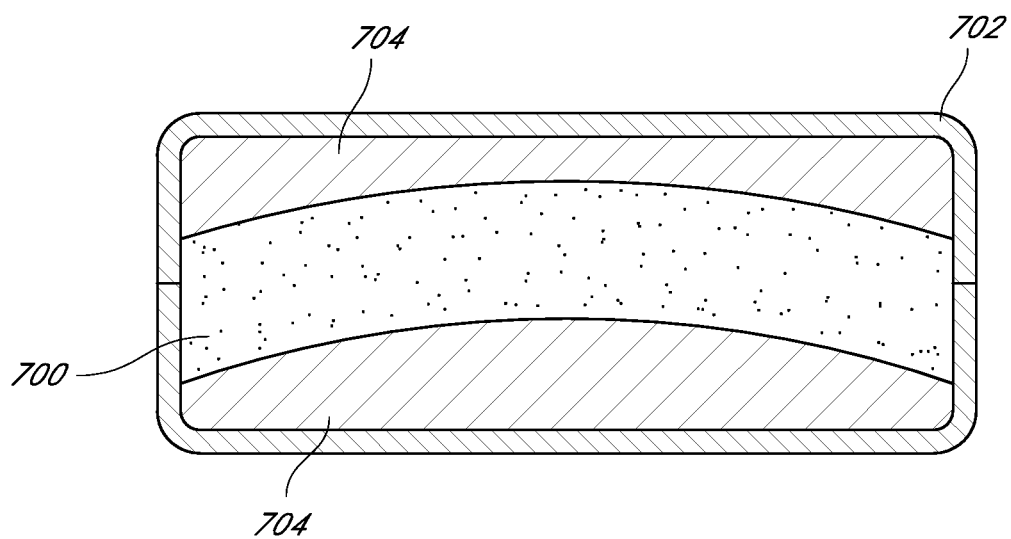
FIG. 7 is a cross-sectional view of a thermoelectric device in a housing configured to accommodate change of curvature of a substrate according to one embodiment.

With reference to FIG. 7, a thermoelectric device 700 can be generally positioned within a housing 702. As shown in the illustrated embodiment, the housing 702 can be configured to accommodate the thermoelectric device 700 regardless of how the curvature of the substrates changes in response to selective cooling and/or heating. In some embodiments, the thermoelectric device 700 can be curved as illustrated in FIG. 7, with the upper substrate expanding and the lower substrate contracting. However, if the current through the thermoelectric device 700 is reversed, it will be appreciated that the curvature of the thermoelectric device 700 can be opposite than as illustrated.

The changing shape of the thermoelectric device 700 can be accommodated within the housing 702 using one or more flexible materials 704 around the thermoelectric device 700. For example, in some embodiments, the housing 702 comprises soft foam that permits the adjacent thermoelectric device 700 to flex while still providing the necessary support. It will be appreciated that one or more other materials can be used between the outside of the thermoelectric device 700 and the inside of the housing 702, either in lieu of or in addition to the foam. The percentage of the free volume between the thermoelectric device 700 and the housing 702 occupied by the foam or other flexible material 704 can vary depending on the particular application.

Figure 8:
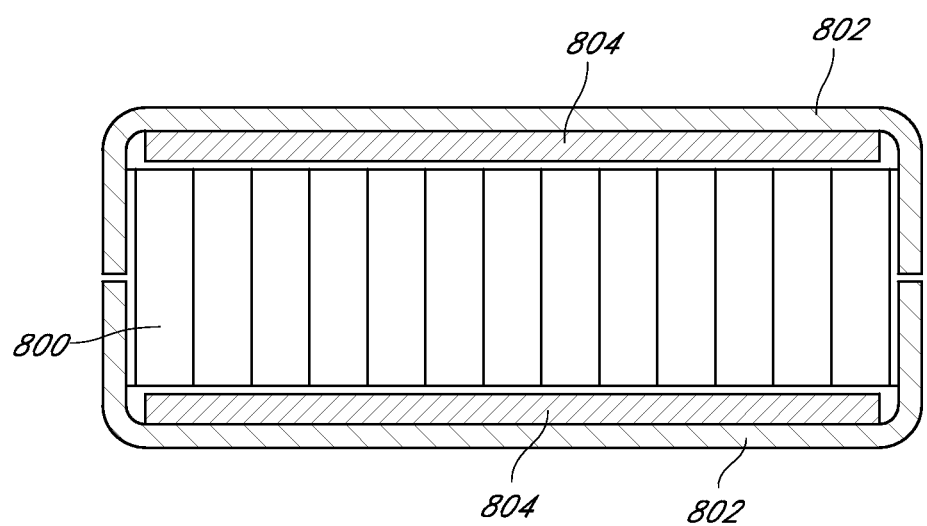
FIG. 8 is a cross-sectional view of a thermoelectric device in a housing having stress absorbing pads according to one embodiment.

As illustrated in FIG. 8, a thermoelectric device 800 can be disposed within a housing 802 having one or more cushioning members 804 (e.g., impact or stress absorbing pads). In the depicted embodiment, the cushioning members 804 are positioned along the top and bottom inside surfaces of the housing 802. However, cushioning members 804 can be positioned in one or more other places of the housing. In some embodiments, cushioning members 804 positioned on the top and bottom sides of a thermoelectric device 800, along with the removal of gaskets or other similar members from the sides of the housing 802 can advantageously help reduce lateral forces and/or other types of lateral stresses and strains on the thermoelectric device 800. In some embodiments, the pads 804 comprise polyethylene foam (e.g., Volara®), other types of foam and/or any other type of cushioning material.

Figure 9:
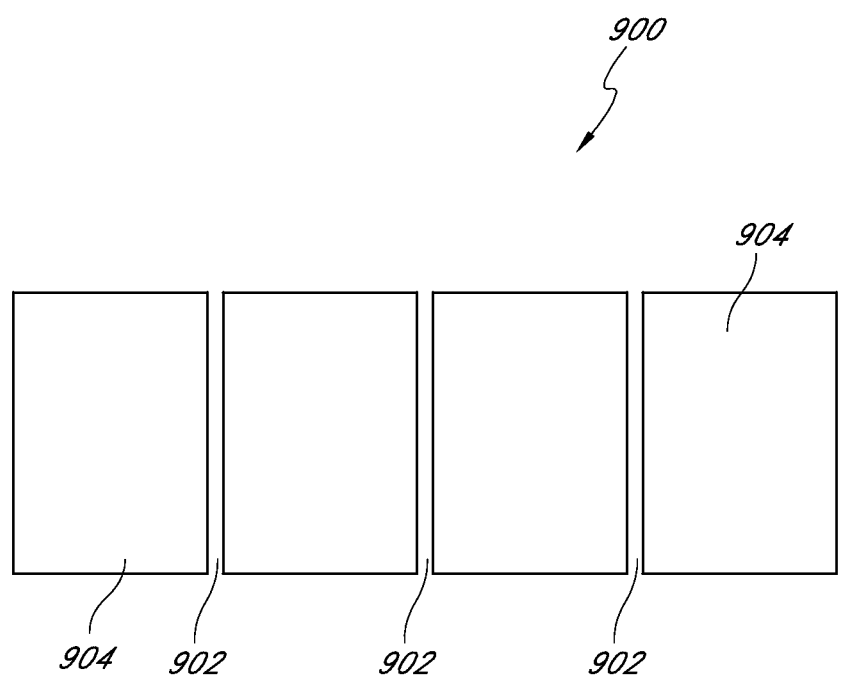
FIG. 9 is a plan view of segmented copper pads with expansion joints according to one embodiment.

FIG. 9 illustrates an embodiment of a substrate 900 (e.g., heat conducting layer, fin pads, etc.) is segmented into a plurality of sections 904. As discussed, the heat substrate 900 can provide a surface onto which the heat transfer members (e.g., fins) can attach (e.g., see element 34 of FIG. 2). As shown, the segmentation of the substrate 900 (e.g., fin pads) can effectively create expansion joints or gaps 902 between the adjacent sections 904 of the substrate 900. In some embodiments, these joints or gaps 902 can help alleviate the stresses caused by the differential heating and/or cooling imposed on the substrate 900, one or more of its components (e.g., fin pads, heat conducting layer, conductive tabs, etc.), the adjacent heat transfer devices (e.g., fins), semiconductor elements and/or any other portion of a thermoelectric device.

With continued reference to FIG. 9, the adjacent sections 904 can be configured to move relative to each other as the corresponding surface of the thermoelectric device is heated or cooled. Thus, the expansion joints or gaps 902 can be preferably sized, shaped and otherwise configured to accommodate a particular application. In some arrangements, the inclusion of a plurality of separate sections 904, such as those illustrated in FIG. 9, can reduce the bending or other shape changes to the substrate 900 and/or any of its individual components or other adjacent portion of the thermoelectric device (e.g., fins pads, conductive tabs, heat transfer members, semiconductor elements, etc.).

It will be appreciated that a substrate 900 can comprise more or fewer than four sections 906. Further, the shape, size, dimensions, materials of construction and/or other properties of the substrate 900 and the intermediate expansion joints or gaps 902 can be selected to suit a particular application. Regardless of the exact configuration of a segmented substrate 900, the plurality of sections 904 can help reduce the effects of expansion and/or contraction on the thermoelectric device and its various components. In some embodiments, a substrate is segmented in both directions to alleviate thermal stresses that may develop while the thermoelectric device is being used.

Figure 10:
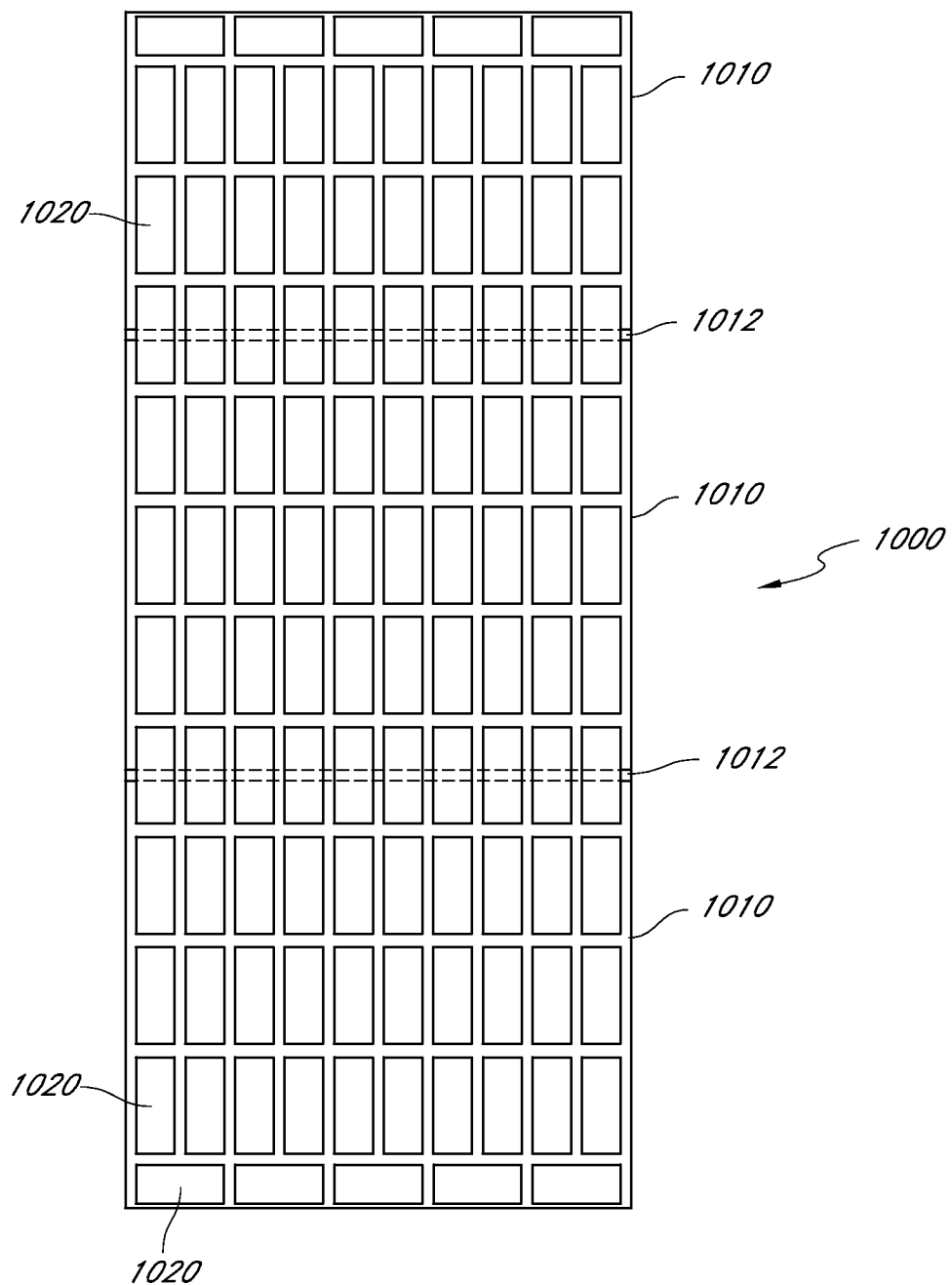
FIG. 10 is a plan view of segmented copper pads with expansion joints on top of pellet interconnects according to an embodiment of the invention.

FIG. 10 illustrates another embodiment of a segmented substrate 1000 (e.g., heat conducting layer, fin pads, conductive tabs, etc.). In FIG. 10, the substrate 1000 comprises three separate pads or sections 1010 illustrated with dashed lines. The pads or sections 1010 are illustrated as being behind the conductive tabs 1020 or pellet interconnects. In some embodiments, the pads or sections 1010, which can be configured to attach to the heat transfer members (e.g., fins), comprise copper and/or some other type of material having desirable heat transfer properties. As shown, the substrate 1000 comprises expansion joints 1012 or gaps between the adjacent sections 1010. As discussed herein with respect to other embodiments, these expansion joints 1012 can be sized, shaped and/or otherwise configured to accommodate the expected expansion and contraction of the substrate 1000 and its various components. Although in the depicted embodiment, a total of three pads or sections 1010 are included, it will be appreciated that a substrate 1000 may comprise more or fewer pads or sections 1010, as desired or required for a particular application or use.

With continued reference to FIG. 10, the separate sections 1010 can be attached to the fins or other heat transfer devices (not shown). In the illustrated embodiment, some of the semiconductor elements 1020 or pellet interconnects are configured to extend over expansion joints 1012 of the substrate 1000. In other embodiments, however, the pellet interconnects 1020 can be situated so that they extend across fewer or no expansion joints 1012 of the substrate 1000.

Figure 11:
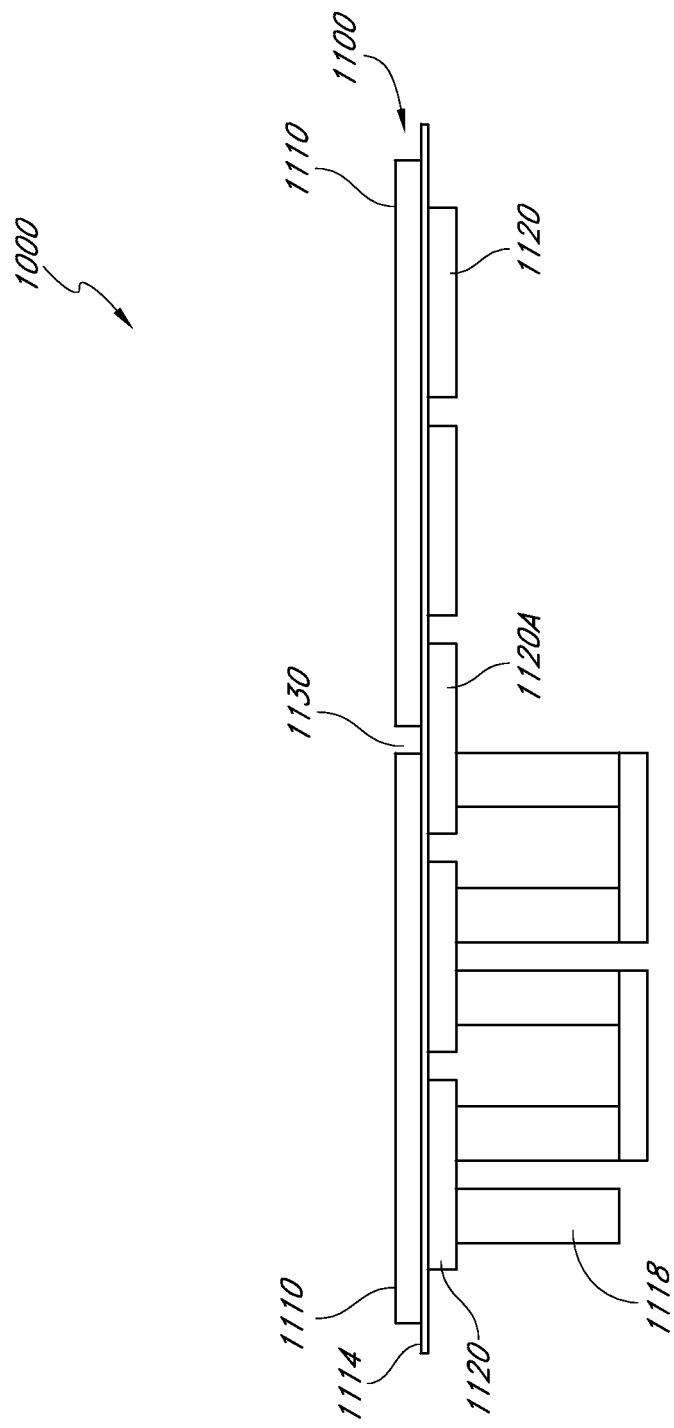
FIG. 11 is a side view of fin pads that straddle pellet interconnects according to one embodiment.

FIG. 11 illustrates one embodiment of a pellet interconnect 1120 extending across the expansion joint 1130 (e.g., gap) of a substrate 1100. In addition, as discussed, an electrical insulating layer 1114 is preferably positioned adjacent the pellet interconnects 1120, 1120A. In some embodiments, the electrical insulating layer 1114 comprises polyimide film and/or any other material configured to provide the desired electrical isolation and thermal conductivity between the adjacent layers or components. As discussed, it will be appreciated that a polyimide film and/or any other electrical insulating layer 1114 can be placed adjacent to the electrical conductor pads (e.g., pellet interconnects or any other member electrically connecting the semi-conductor elements or pellets 1118). For example, such an insulating layer 1114 can be included in any of the embodiments discussed, illustrated and/or otherwise disclosed in this application, or equivalents thereof.

As shown, the depicted substrate 1100 (e.g., heat conducting layer, fin pads, conductive pads, etc.) comprises a total of two adjacent sections 1110. As discussed, the sections 1110 of the substrate 1100 can comprise copper and/or some other material having relatively high heat transfer properties. In the illustrated embodiment, an expansion joint 1130 between the two adjacent sections 1110 of the substrate is positioned over one of the pellet interconnects 1120A. This type of configuration can help reinforce the structural integrity of the substrate assembly, especially since the insulating layer of the substrate typically comprises a structurally weak material (e.g., polyimide).

Figure 12:
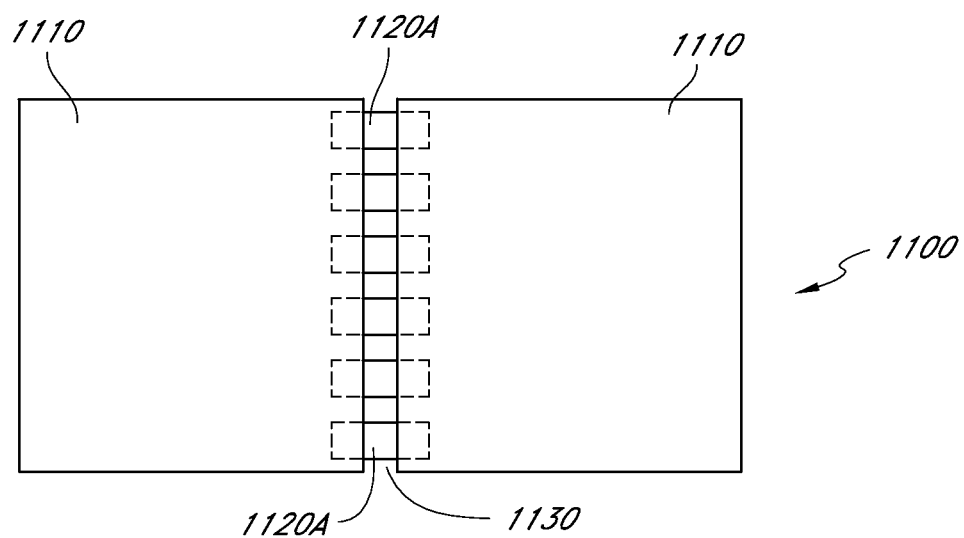
FIG. 12 is a plan view of fin pads that straddle pellet interconnects according to one embodiment.

FIG. 12 illustrates the substrate 1100 shown in FIG. 11 and discussed above, which comprises two or more separate sections 1110. In FIG. 12, the two sections 1110 of the substrate 1100 are positioned, sized, shaped and/or otherwise configured to extend across a plurality of pellet interconnects 1120A. As discussed, this can help insure the integrity of the substrate assembly. On the other hand, for any of the embodiments disclosed herein, it may be beneficial to not include fin pads or pellet interconnects along the expansion joints to ensure that the substrate can safely and adequately accommodate the thermal stresses generated by the operation of a thermoelectric device.

Figure 13:
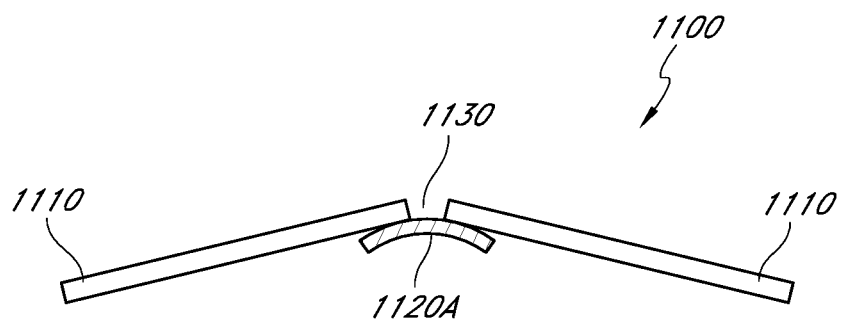
FIG. 13 is a cross-sectional view of fin pads configured to straddle a pellet interconnect according to an embodiment.

In addition, the cross-sectional view of FIG. 13 illustrates one embodiment of two sections 1110 of a substrate 1100 extending across a pellet interconnect 1120A. As shown in FIG. 13, in some embodiments, the substrate 1100 can be configured to bend at the expansion joint 1130 between the two adjacent sections 1110 when subjected to thermal expansion and/or contraction. Each of the sections or pads 1110 that comprises the substrate 1100 is less stiff than the substrate 1100 would have been as a larger single piece member. Accordingly, segmented embodiments similar to those illustrated and discussed herein are permitted to bend more easily along the one or more expansion joints 1130 or gaps. Consequently, the substrate 1100, its various components and/or the other portions of a thermoelectric device can be better adapted to accommodate the curvature and any other shape changes resulting from a temperature differential during the operation of the thermoelectric device.

Figure 14:
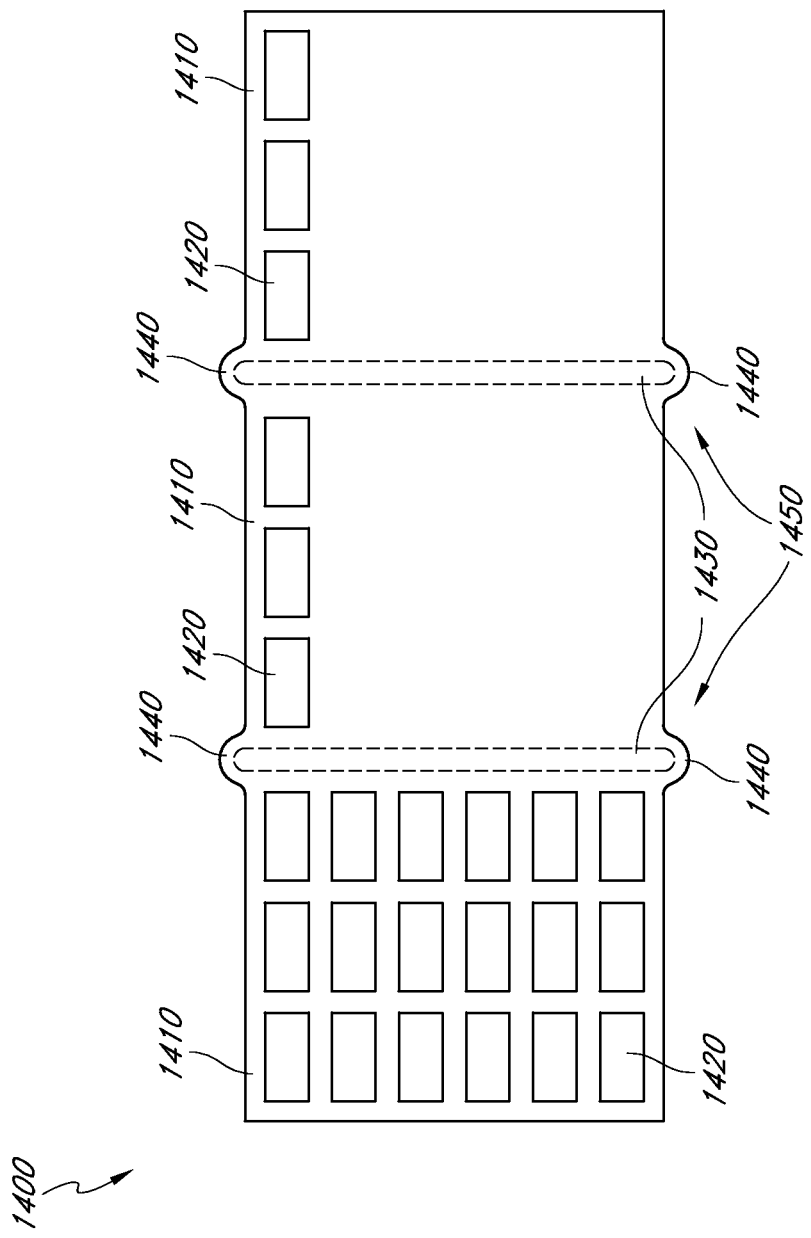
FIG. 14 is a plan view of fin pads comprising gaps and interconnects according to one embodiment.

In other embodiments, as depicted in FIG. 14, the expansion joints or gaps 1430 between adjacent fin pads 1410 are not configured to be straddled by one or more pellet interconnects 1420. Instead, the pellet interconnects 1420 can completely fall within the area provided by an adjacent fin pad 1410. As discussed, in some embodiments, this is preferred because it permits the expansion joints of the substrate to better accommodate the thermal forces and stresses generated by the temperature differential across the thermoelectric device. In the illustrated embodiment, the various fin pads 1410 or individual sections of the substrate 1400 are separated by expansion joints or gaps 1430. Further, to facilitate in maintaining the adjacent fin pads 1410 in a desired spatial orientation and to help ensure the structural integrity of the substrate 1400 can comprise one or more connecting members or supports 1440. In some embodiments, the connecting members 1440 are sized, shaped and otherwise configured to maintain the structural integrity of the layer 1400 as a whole during the bending, flexing and other movements to which a thermoelectric device may be objected during operation. In some arrangements, the interconnects 1440 include copper or other metal (e.g., the fin pads) and/or the polyimide layer or other thermal conductive layer attached to the copper. As discussed, the substrate 1400 can be etched or other manufactured to advantageously include such interconnects 1440 between expansion joints 1430 and/or any other location.

In other embodiments, the interconnects 1440 can be configured for only temporary attachment. For example, once the fins or other heat transfer members (not shown) are joined to the individual fin pads 1410, the interconnects 1440 can be cut or otherwise compromised to allow for a greater degree of expansion and/or contraction of the fin pads 1410 relative to each other. In the illustrated arrangement, there are two interconnects 1440 between adjacent fin pads 1410. Further, the interconnects are relatively small and are generally positioned along the periphery of the substrate 1400. However, it will be appreciated that a thermoelectric device can comprise more or fewer interconnects 1440 than illustrated and discussed herein. In addition, the size, shape, position, spacing, location, method of attachment to/detachment from the fin pads 1410, thickness, materials of construction and/or other properties of the interconnects or supports 1440 can vary, as required or desired by a particular application.

Further, the expansion joints or gaps 1430 between adjacent fin pads 1410 can be filled with an insulating film or other space filler material (not shown). For example, in some embodiments, the insulating film can comprise polyimide or the like. Preferably, the expansion joints or gaps 1430 do not comprise copper or any other electrically conductive material. This can facilitate the movement (e.g., lateral movement, bending, etc.) of the various fin pads 1410 relative to each other during the operation of the thermoelectric device.

Figure 15:
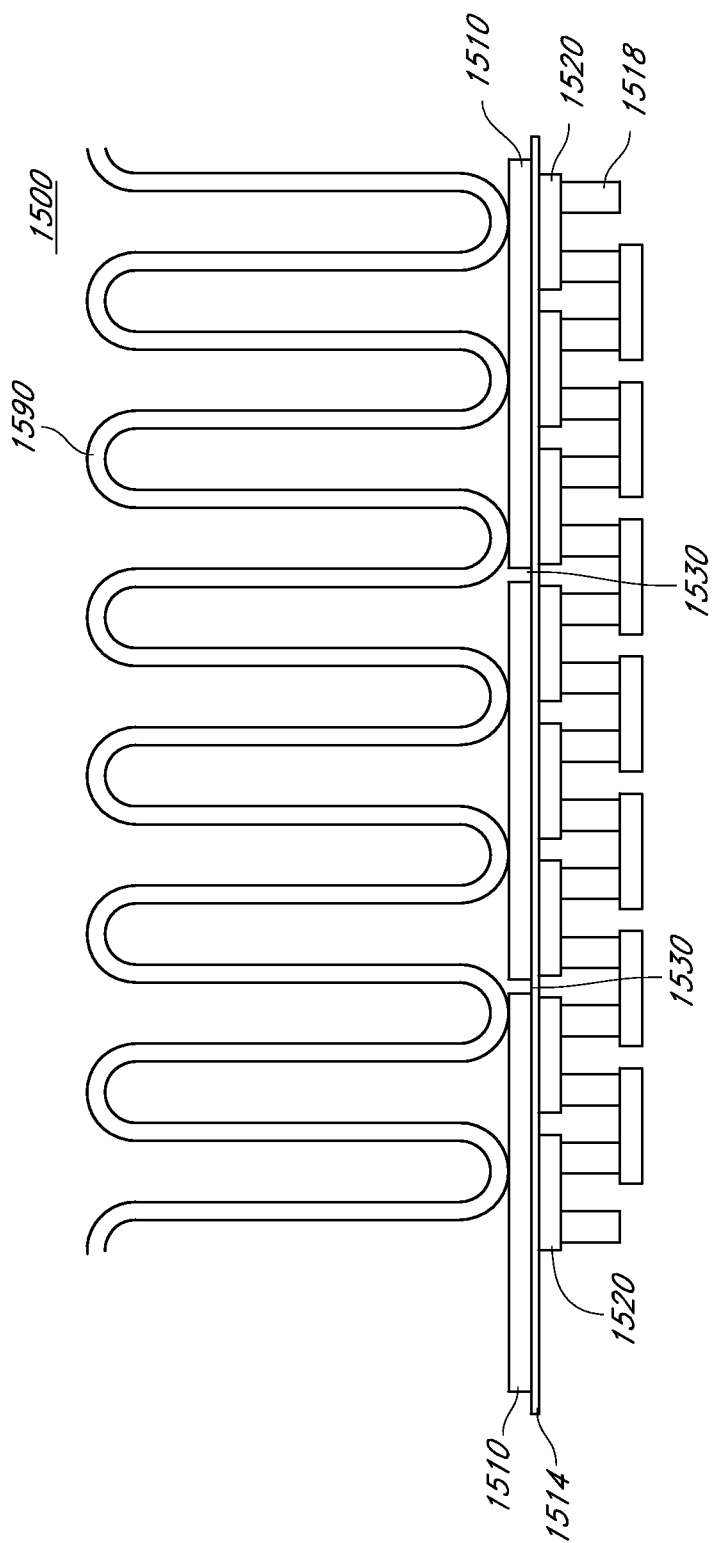
FIG. 15 is a side view of a thermoelectric device having gaps between fin pads according to one embodiment.

FIG. 15 illustrates another embodiment of a thermoelectric device 1500 that comprises gaps or expansion joints 1530 between adjacent fin pads 1510. In order for an expansion joint 1530 to properly accommodate for the desired relative movement between adjacent fin pads 1510, each fold of the fins or other heat transfer device 1590 is configured to attach to only a single fin pad 1510. Therefore, no fin fold is soldered or otherwise attached to more than one fin pad 1510. This ensures that the movement of the fin pads 1510 and/or the heat transfer members 1590 will not be undesirably restricted during the operation of the thermoelectric device 1500. For example, if a fin fold straddled a gap 1530, and was thus connected to two adjacent fin pads 1510, the expansion joint 1530 would not be allowed to adequately permit the various components of the substrate or other portions of the thermoelectric device 1500 to move and/or flex relative to each other. As discussed with respect to FIG. 11 herein, a polyimide or other electrical insulating layer or element 1514 can be preferably included in the substrate between the electrical conducting elements or pads 1520 and the fin pads 1510.

As used herein, the term "electrical insulating layer" is a broad term, and is used in accordance with its ordinary meaning and may include, without limitation, a polyimide film or any other material configured to provide electrical insulation and thermal conduction. The terms "electrical insulating layer," "electrical insulating element," "substrate," "electrical insulating substrate," "polyimide" and other related terms may be used interchangeably herein.

As used herein, the term "semiconductor element" is a broad term, and is used in accordance with its ordinary meaning and may include, without limitation any conductive element used in a thermoelectric device or the like to transmit current through a desired pattern or sequence. The terms "semiconductor element," "thermoelectric elements," "semiconductor pellet," "pellet," "conductor element, member or pellet," "conductive element, member or pellet," "conduction element, member or pellet," and other related terms may be used interchangeably herein.

As used herein, the term "heat conducting element" is a broad term, and is used in accordance with its ordinary meaning and may include, without limitation any member or film configured to provide a support structure for heat transfer elements. The terms "heat conducting element or layer," "fin pads," "heat conducting substrate," "heat transfer member support structure" and other related terms may be used interchangeably herein.

Figure 16:
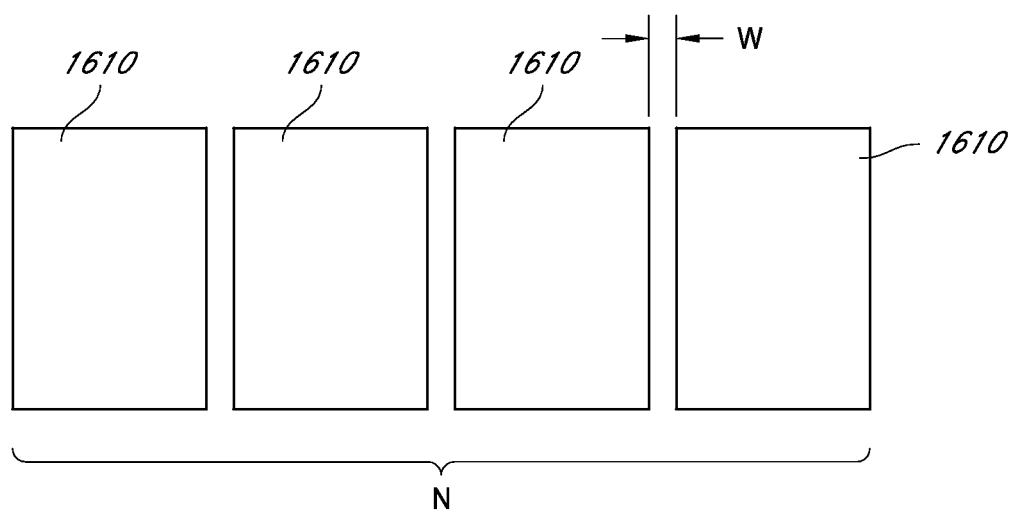
FIG. 16 is a top view of fin pads according to one embodiment.

The embodiment of FIG. 16 illustrates a total of four adjacently-positioned fin pads 1610 or other portions of a substrate that are generally separated by a gap having a width W. It should be recognized that in addition to other factors and features described and illustrated herein, the number N of the fin pads 1610 per unit length can be another way of accommodating for thermal expansion and/or contraction of a thermoelectric device. As discussed, the effects of thermal expansion and/or contraction can become exacerbated with increasing length. For example, if one of the dimension of an object (e.g., a thermoelectric device) is large relative to another dimension, the thermal expansion problem becomes more critical along that longer dimension. In such embodiments, however, it may be desirable to segment the object along the direction of the longer dimension, as is illustrated in FIG. 16. The spacing W and the number N of segments in one or more directions can be advantageously adjusted as desired or required by a particular application. For instance, these factors (e.g., W, N, etc.) can be selected based on the anticipated operating temperature differential of the thermoelectric device, the types of material used and/or the like.

Figure 17:
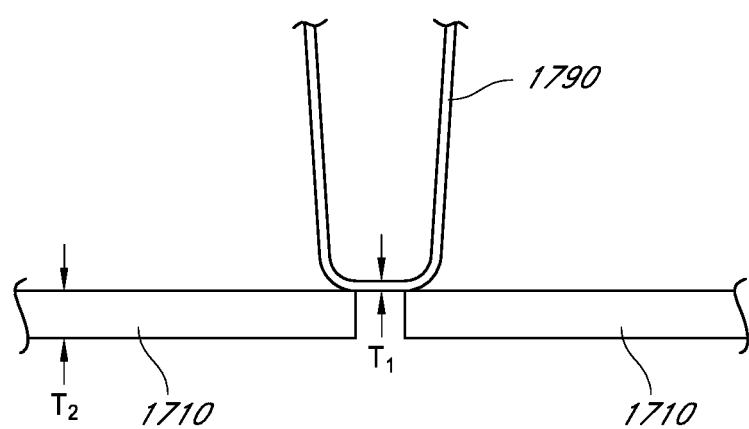
FIG. 17 is a cross-sectional view of a thin fin on two fin pads according to one embodiment.

As illustrated in FIG. 17, in embodiments where the fins or other heat transfer members 1790 straddle the fin pads 1710 over the gap or expansion joint, a desired level of flexibility in the fins 1790 can be maintained if the fin thickness $T_1$ is smaller than the fin pad thickness $T_2$. For example, the thinner that the fin 1790 is, the more flexible it becomes. In some embodiments, the relative flexibility of the fin 1790 can be proportional to $1/t^3$, where t is a ratio of $T_1$ to $T_2$. In some embodiments, $T_1$ can be approximately 0.003 inches and $T_2$ can be approximately 0.006 inches. However, the thickness of $T_1$ and $T_2$, and thus the ratio of $T_1$ to $T_2$, can be greater or smaller than indicated herein. Further, it will be appreciated that the flexibility of the fin 1790 and/or any other component of the thermoelectric device can be selectively controlled by varying one or more other properties or characteristics, such as, for example, the types of the materials used, the shape, size, thicknesses, other dimensions of the various components, the spacing and orientation of the various components and/or the like.

In other embodiments, the fins or other thermal transfer members can be permitted to straddle the expansion joints of the fin pads if the fins that straddle the expansion joints are not attached to the fin pads. Thus, the fins or other heat transfer member will not inhibit the lateral movement, flexing and/or other types of relative movement between adjacent fin pads. In the event that the fins or other heat transfer members are attached to adjacent fins pads or portions of the substrate, the ability of the expansion joints to adequately accommodate thermal stresses may be reduced or eliminated. Thus, in some embodiments, a heat transfer member straddles an expansion joints without being attached to fin pads or other portions of the substrate on either side of the expansion joint.

Figure 18A:
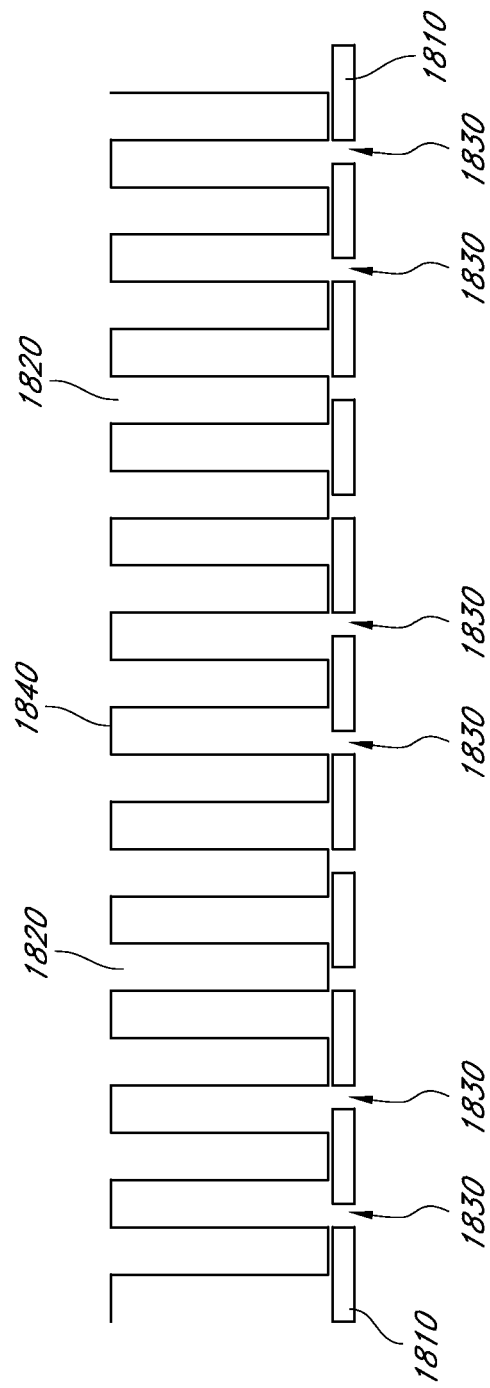
FIG. 18A is a side view illustrating fins on fin pads according to one embodiment.

FIG. 18A illustrates another embodiment that is configured to advantageously permit the thermoelectric device to expand, contract, flex and/or otherwise move in response to thermal differentials. As shown, even if the spacing 1820 between adjacent fins or other heat transfer members 1840 is uncontrolled (e.g., random, not selected to coincide with the gaps of the fin pads 1810, etc.), at least some of the expansion joints 1830 will be capable of adequately performing their function as long as the number of fin pads 1810 is large enough. That is, even if the fin spacing 1820 is not controlled against the width of the expansion joint or intervals between the fin pads 1810, aligned expansion joints 1830 can be obtained at random positions. Thus, in FIG. 18A, the gaps or expansion joints 1830 that are not straddled by the fins or other heat transfer members 1840 will generally be capable of expanding, contracting, flexing and/or otherwise moving in response to thermal differentials. Thus, if the fin pads or segmented portions of the substrate are small enough, it may not be important to determine where exactly the fins are positioned relative to the substrate. For example, such a configuration can provide some statistical certainty that a particular fin of other heat transfer member will not straddle an expansion joint. The fins or other heat transfer member can be sized, shaped, spaced and otherwise configured to prevent such straddling of expansion joints. This can help reduce the time and cost of manufacturing and assembly of such devices, as the need to carefully inspect the connections between the fins and the substrate can be advantageously eliminated.

Figure 18B:
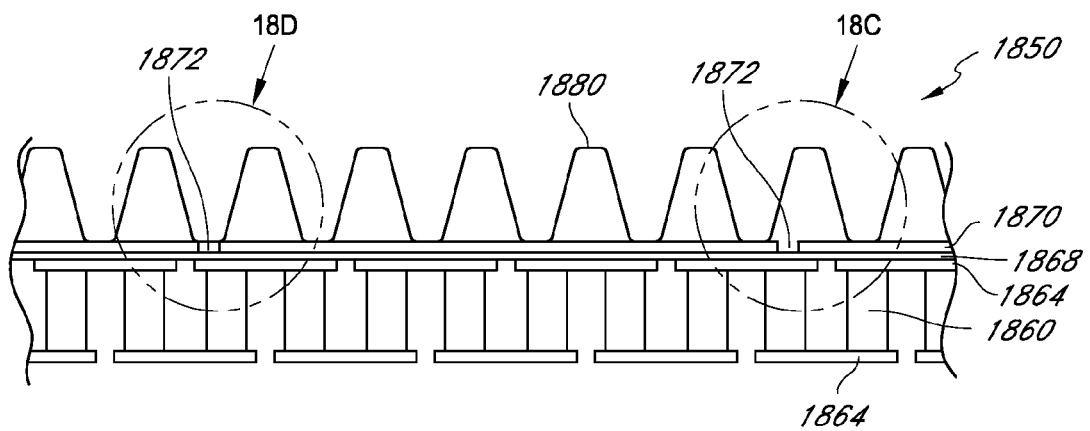
FIG. 18B is a side view illustrating a thermoelectric device comprising a unitary heat transfer member according to one embodiment.
Figure 18C:
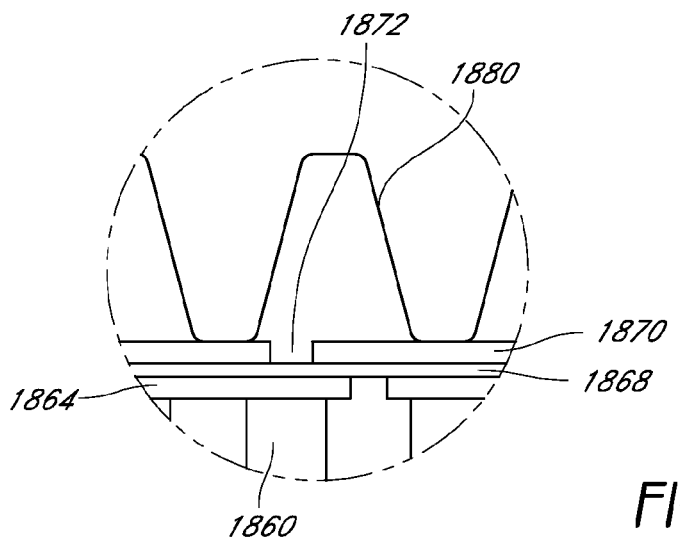
FIG. 18C is a detailed side view of the thermoelectric device of FIG. 18B.

FIG. 18B illustrates another embodiment of a thermoelectric device 1850 which comprises expansion joints 1872 for thermal expansion/contraction and/or thermal isolation purposes. As shown, the joints 1872 are generally formed by including separate (or non-continuous) thermal conductive members 1870. It will be appreciated, however, that the stress relief joints 1872 can be differently configured than illustrated and discussed herein. As with other embodiments disclosed herein, the substrate of a thermoelectric device 1850 can advantageously include an electrical isolation member or layer 1868 between the thermal conductive members 1870 and the semiconductor elements 1860 and interconnection members 1864.

With continued reference to FIG. 18B, the thermoelectric device 1850 can include a single heat transfer device 1880 (e.g., fins) that is configured to attached to the plurality of thermal conductive members 1868 situated adjacent thereto. However, as illustrated in the detailed views of FIGS. 18C and 18D, the heat transfer device 1880 may not attach or otherwise contact the adjacent thermal conductive member 1868 in exactly the same location. For example, in FIG. 18C, the heat transfer member 1880 attaches to the thermal conductive member 1868 away from the joint 1872 (e.g., the gap between adjacent thermal conductive members 1868). Thus, the fin or other heat transfer member 1880 can move with the substrate portion to which it is attached.

Figure 18D:
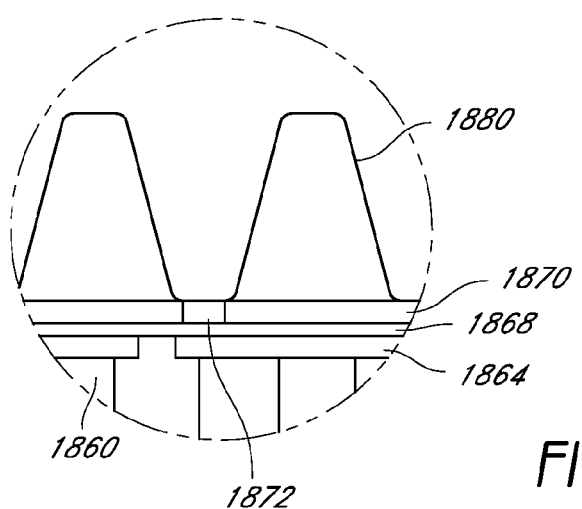
FIG. 18D is a detailed side view of the thermoelectric device of FIG. 18B.

Alternatively, as illustrated in FIG. 18D, the heat transfer member 1880 may happen to overlap a joint 1872, thereby attaching to both of the adjacent thermal conductive members 1868 (e.g., fin pads). Therefore, during the operation of the thermoelectric device 1850, the temperature differential between the device's "hot" and "cold" sides may cause the fins 1868 to move relative to one another. Thus, undesirable stresses may be imposed between the portion of the heat transfer member 1880 depicted in FIG. 18D and the adjacent thermal conductive members 1868, because the heat transfer device 1880 will not be permitted to move freely.

Figure 18E:
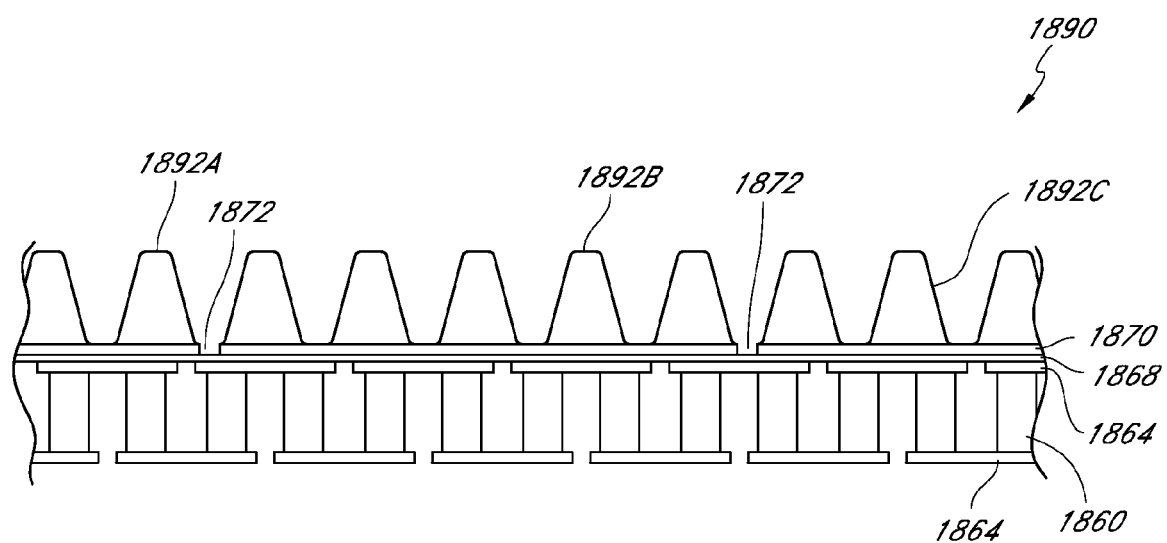
FIG. 18E is a side view illustrating a thermoelectric device comprising a plurality of heat transfer members according to another embodiment.

According to the embodiment illustrated in FIG. 18E, each segmented portion of the substrate (e.g., the thermal conductive member 1868) includes its own heat transfer device 1892A, 1892B, 1892C. This helps prevent the problem depicted in FIG. 18D and discussed above. In FIG. 18E, each heat transfer device 1892A, 1892B, 1892C is confined within a particular thermal conductive member 1868, thereby eliminating the possibility that a heat transfer device will straddle or overlap a joint 1872. Under such a configuration, it will be appreciated that two or more heat transfer devices (e.g., fins) can be situated on a single thermal conductive member 1868.

Figure 19:
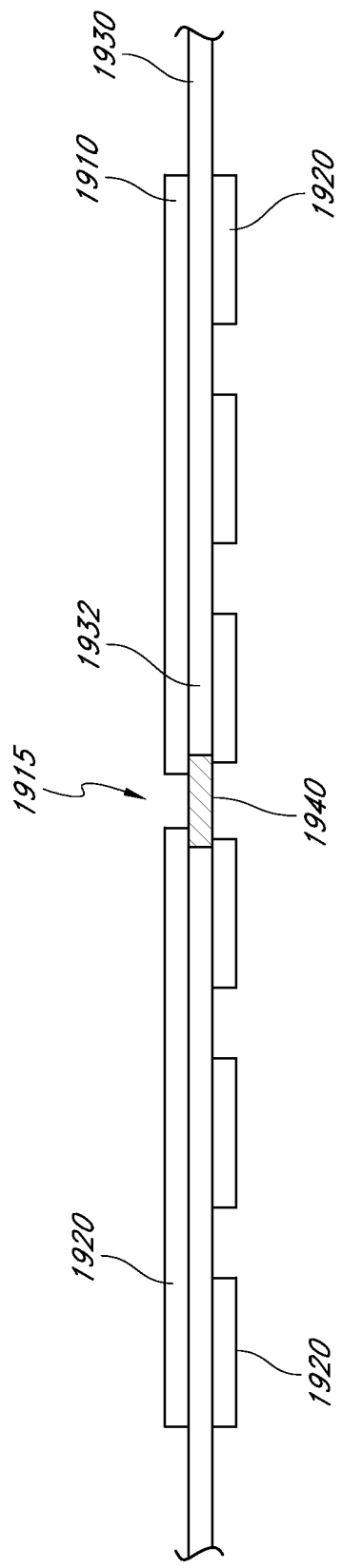
FIG. 19 is a cross-sectional view of polyimide layer situated between fin pads and pellet interconnects according to one embodiment.

With reference to FIG. 19, an insulating layer 1930 of the substrate can comprise a flexible portion or section 1940 to help provide at least a portion of the desired flexibility to the thermoelectric device. According to some embodiments, insulating layers 1930, which are typically disposed between pellet interconnects and fin pads, include one or more polyimide or ceramic layers or the like. Such polyimide layers can be relatively flexible if they are not compactly filled. For example, unfilled polyimide (e.g., Kapton®, other types of polyimide film, etc.) can be relatively flexible, whereas filled polyimide can be relatively non-flexible and brittle. In thermoelectric devices, the use of filled polyimide is often desirable because it can offer enhanced thermal conductivity and electrical insulating properties.

In some embodiments, therefore, the insulating layer 1930 can include both filled and unfilled portions to provide both a desired level of flexibility and a desired level of thermal conductivity. For instance, with continued reference to FIG. 19, a portion 1932 of the insulating layer 1930 can comprise filled polyimide, making it relatively brittle and non-flexible. However, other portions 1940 of the insulating layer 1930 can comprise unfilled polyimide or the like to provide the desired flexibility in light of the anticipated thermal expansion and contraction. Thus, the insulating layer 1930 can comprise sections of both filled and unfilled polyimide or the like in order to retain a desired level of flexibility at the expansion joints 1915.

In the embodiment of FIG. 19, the unfilled (e.g., flexible) portions 1940 of the insulating layer 1930 are relatively small compared to the filled portions 1932. However, in other arrangements the relative length of the unfilled and filled portions 1932, 1940 can be different than illustrated and disclosed herein, depending on the particular application. Further, it will be appreciated that a thermoelectric device can include one or more other flexible and/or non-flexible (e.g., thermally conductive, electrically isolating, etc.) materials, either in lieu of or in addition to the polyimide.

Figure 20:
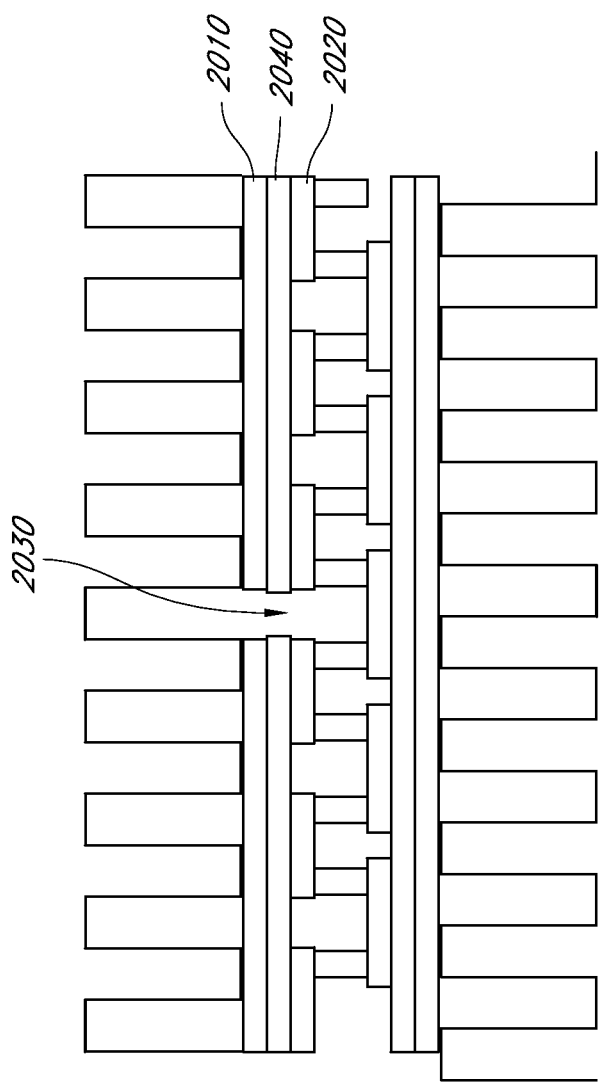
FIG. 20 is a cross-sectional view of a thermoelectric device comprising gaps according to one embodiment.

FIG. 20 illustrates yet another embodiments for accommodating for thermal expansion and contraction during the operation of a thermoelectric device. In the illustrated arrangement, the thermoelectric device includes one or more gaps 2030 in the electrical insulating layer 2040 and the heat conducting layer (e.g., fin pads) 2010 along at least one of its sides. In the illustrated embodiment, such a gap 2030 is positioned along the top portion of the thermoelectric device. As shown, in order for the gap 2030 to properly perform its function as an expansion joint, no mechanical connections, including semiconductor elements 2020 or the like, are positioned in the vicinity of the gap.

Depending on the length and other dimensions of the thermoelectric device, the material used, the expected temperature differential and/or one or more other factors, a thermoelectric device can comprise two or more gaps 2030, as illustrated in FIG. 20. These gaps 2030 can be positioned along the upper and/or lower portion of the thermoelectric device.

Figure 21:
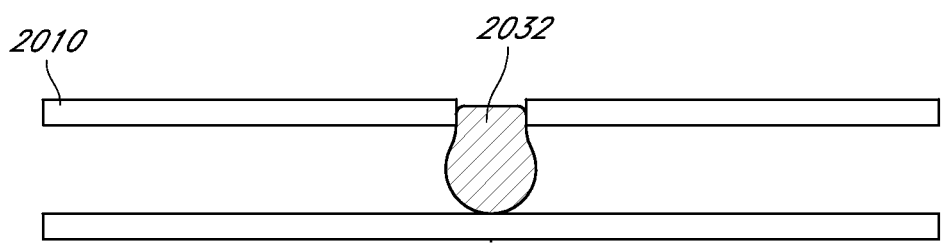
FIG. 21 is a cross-sectional view of a gap filled with a sealant according to one embodiment.

With reference to FIG. 21, a thermoelectric device can include a sealant 2032 at an expansion joint or gap. Such sealant can help protect the device from one or more pollutants, water, moisture or other fluids, undesired substances, environmental conditions and/or other items or circumstances that may cause damage. In some embodiments, the sealant 2032 can be configured to fill the targeted gaps without affecting the flexibility of the expansion joints. The sealant 2032 can include room temperature vulcanization (RTV), silicone, other flexible materials and/or the like. In some embodiments, the polyimide layer or other portion of the substrate 2010 may need to be cut or other compromised in order to inject the sealant or other substance within the expansion joint.

Figure 22A:
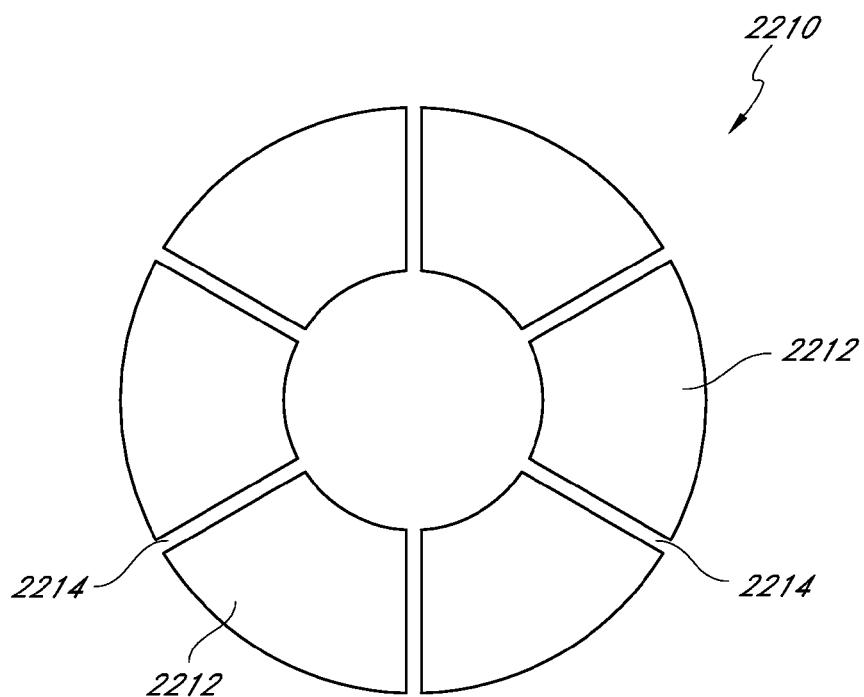
FIG. 22A is a plan view of a top substrate according to one embodiment.

FIG. 22A illustrates an embodiment of a circular thermoelectric device that comprises a segmented substrate on one of its sides 2210. As with other embodiments discussed and illustrated herein, adjacent substrate segments 2212 are separated by gaps or expansion joints 2214. In the illustrated embodiment, the expansion joints 2214 have a generally radial pattern extending completely through the substrate. However, as with other variations and arrangements discussed herein, the expansion joints 2214 may extend only partially through the substrate width. In some embodiments, permanents or temporary connectors can be used to join adjacent segments 2212 of the substrate. In other embodiments (FIG. 34), an annular or circular substrate like the one illustrated in FIG. 22A can include one or more circumferential expansion joints, either in lieu of or in addition to the depicted radial joints 2214. As discussed, the quantity, orientation (lateral, circumferential, radial, etc.) size, location, spacing and/or other details regarding the expansion joints can be varied as desired or required. In some embodiments, the need for expansion joints depends on the length or other dimension of the substrate in a particular direction. It is generally desirable to segment relative long dimensions of a substrate with one or more expansion joints to reduce the thermal stresses therein.

Figure 22B:
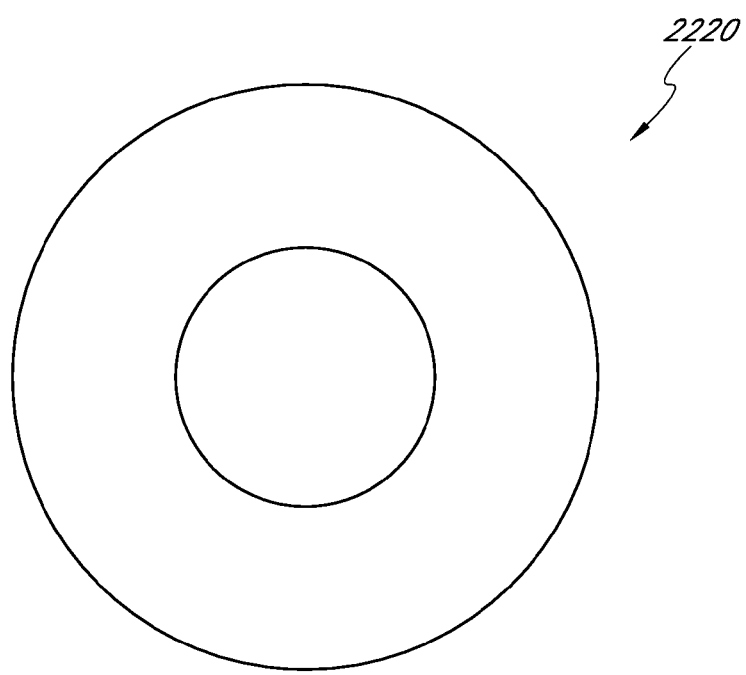
FIG. 22B is a plan view of a bottom substrate according to one embodiment.

With reference to FIG. 22B, the opposite surface 2220 of the substrate illustrated in FIG. 22A can comprise a generally continuous surface, with little or no expansion joints or gaps. This is so because the thermal expansion can be accommodated by the substrate on the opposite side of the thermoelectric device (as shown in FIG. 22A). However, in other embodiments, it will be appreciated that expansion joints 2214 can be included in both the upper and lower substrates of a circular thermoelectric device. In addition, the segmented substrates and the related features and variations disclosed and illustrated herein can be applied to any thermoelectric device, regardless of shape, size and/or general configuration.

FIG. 23A illustrates an embodiment of a substrate 2310 for thermoelectric device that comprises segmentations in both the lateral and flow directions. In FIG. 23A, the fluid approaching the thermoelectric device is represented by directional arrows (e.g., fluid flow is generally from left to right as illustrated). Thus, in relatively large substrates or thermoelectric devices, thermal stress resulting from expansion and/or contraction can occur in both directions. Accordingly, FIG. 23A illustrates one embodiment of a thermoelectric device that can result from combining thermoelectric devices that comprise substrate segmentations only in the lateral or the flow direction (FIGS. 23B and 24C). The segmentation of the thermoelectric devices, as discussed and illustrated herein, can also provide thermal isolation to one or more portions of the thermoelectric devices. For additional details and discussion regarding thermal isolation, please see U.S. Pat. No. 6,539,725 to Bell, the entirety of which is hereby incorporated by referenced herein.

With continued reference to FIG. 23A, the illustrated substrate 2310 for an thermoelectric device comprises gaps or other expansion joints 2312, 2314 in both the lateral and flow directions. It will be appreciated that a substrate can also include expansion joints that are oriented in one or more other directions, either in lieu of or in addition to those depicted in FIG. 23A.

Figure 24:
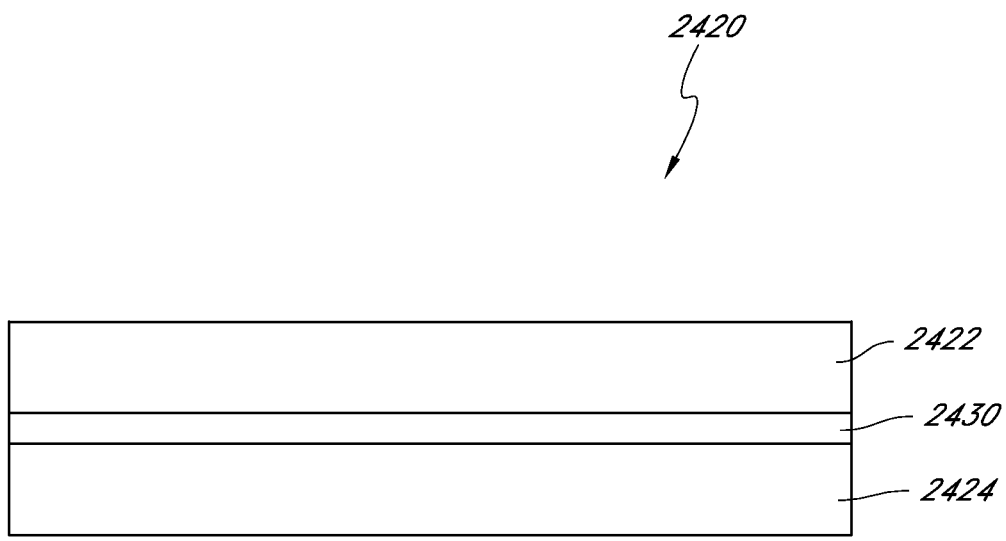
FIG. 24 is a cross-sectional view of a flexible substrate according to one embodiment.

FIG. 24 illustrates one embodiment of a substrate 2420 cross-section. As shown, the substrate 2420 can be of the flexible type, and can include a multi-layer structure. For example, the substrate 2420 comprises a total of three adjacent layers. However, it will be appreciated that a substrate 2420 can include more or fewer layers, as desired or required. With continued reference to the depicted arrangement, a middle insulating layer 2430 is sandwiched between upper and lower copper layers 2422, 2424. The insulating layer 2430 can comprise polyimide and/or any other suitable material.

In one or more of the embodiments disclosed and/or illustrated herein, a need may exist to properly tie together the segmented portions of a substrate. This can be especially important for substrates that have a relatively large number of segmentations, such as, for example, the substrate illustrated in FIG. 23A.

Polyimide or similar materials that often comprise a thermoelectric substrate can be brittle, fragile and/or otherwise vulnerable to damage, especially when subjected to tensile forces. Thus, as illustrated in FIG. 24, a substrate 2420 can comprise one or more layers 2422, 2422 on opposite sides of the polyimide or similar materials. In the illustrated embodiment, the layers 2422, 2422 on either side of the polyimide layer 2430 include copper and/or another metal or non-metal material that is configured to adequately handle tensile and other types of forces to which the substrate may be subjected. As discussed, the layers can be heat bonded to each other. Further, a desired layout of the copper or other metal layers on either side of the middle insulating layer can be produced using etching or another method by which undesired metal portions are removed or otherwise eliminated.

Figure 25:
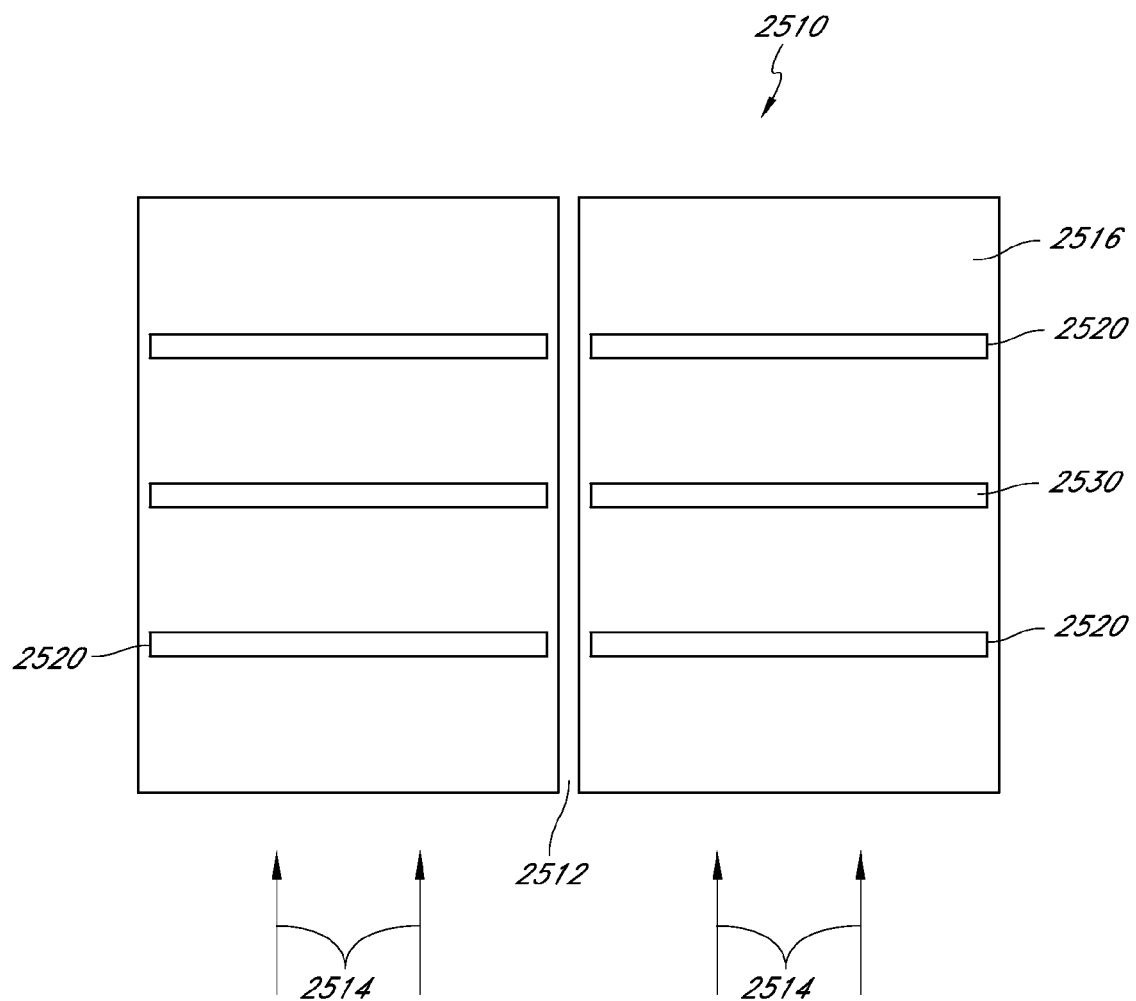
FIG. 25 is a top view of segmented substrates having thermal isolation gaps and lateral bridges according to one embodiment.

With reference to FIG. 25, the substrate 2510 can include fore/aft thermal isolation joints 2512 along the direction of air flow (e.g., represented by the arrows 2514). Such fore/aft thermal isolation can help offset forces which are in the perpendicular to the direction of flow. In addition, as shown in FIG. 25, the substrate 2510 can include one or more lateral structural bridges 2520 that can be configured to provide structural support during the assembly process. In some embodiments, the bridges or gaps 2520 comprise insulating materials, such as, for example, polyimide. Other portions of the substrate can comprise copper/polyimide layers, as discussed herein, and/or other suitable combinations. The bridges can facilitate securing the substrate to the heat exchangers and/or the thermoelectric elements. The bridges permit the substrate to be maintained as a unitary structure despite the presence of the one or more expansion joints. Consequently, the manufacturing and/or assembling such devices and systems in improved and costs are lowered.

Figure 26A:
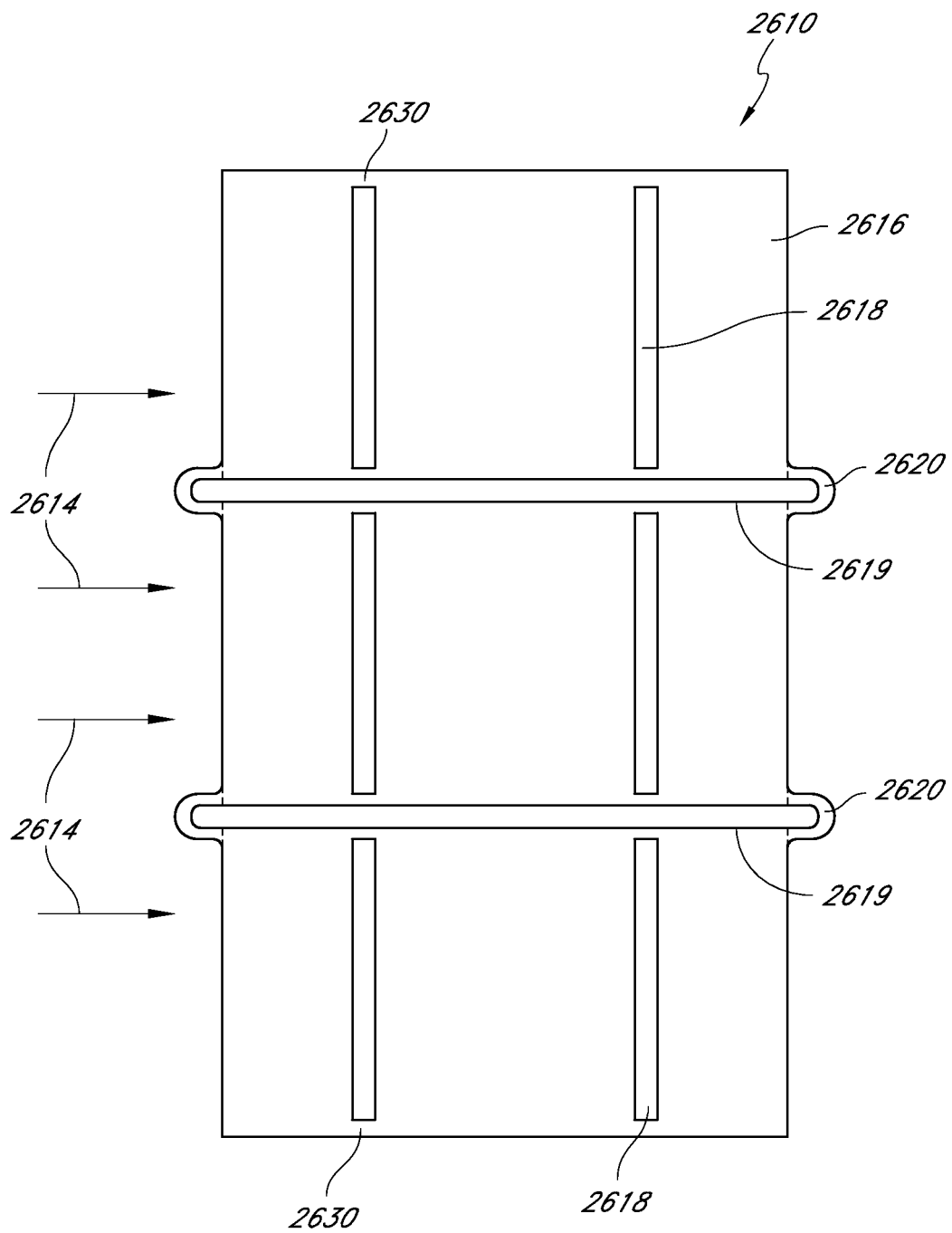
FIG. 26A is a top view of segmented substrates having thermal isolation gaps and lateral bridges according to one embodiment.

As illustrated in FIG. 26A, the thermal conductive member or substrate 2610 can include fore/aft structural bridges 2630 that allow minimal thermal bridging. The arrows 2614 generally represent the direction of air or other fluid relative to the thermoelectric device. Thus, in the illustrated embodiment, the structural bridges 2630 are generally perpendicular to the direction of air flow. The substrate 2610 can comprise one or more alternative lateral bridging members or portions 2620 that are configured to hold the substrate together. In some embodiments, these alternative lateral bridging members 2620 are adapted to remain in place only during soldering or other assembling steps. Thus, such members 2620 would still be capable of flexing or otherwise moving to accommodate the thermal stresses produced in the thermoelectric device. In some embodiments, the lateral bridging members 2620 can extend outside of the outer periphery of the thermoelectric device into which the substrate is included. In the illustrated embodiment, the gaps 2618, 2619 within the substrate 2610 can comprise an insulating material (e.g., polyimide). In some embodiments, the remaining portion 2616 of the substrate 2610 can include copper/polyimide or any other suitable material or combination of materials.

In addition, the use of perpendicular expansion joints or bridges 2630 can offer a secondary benefit. In some embodiments, such joints, bridges or other members 2630 can thermally isolate the fin pads, the fins attached thereto and/or one or more other portions or components of the thermoelectric device. Thus, heat absorbed by the fins in the front portion of the substrate may be prevented, at least partially, from affecting downstream segments of the substrate, fins and/or the like. Consequently, the thermal efficiency and cooling capacity can be advantageously improved.

Figure 26B:
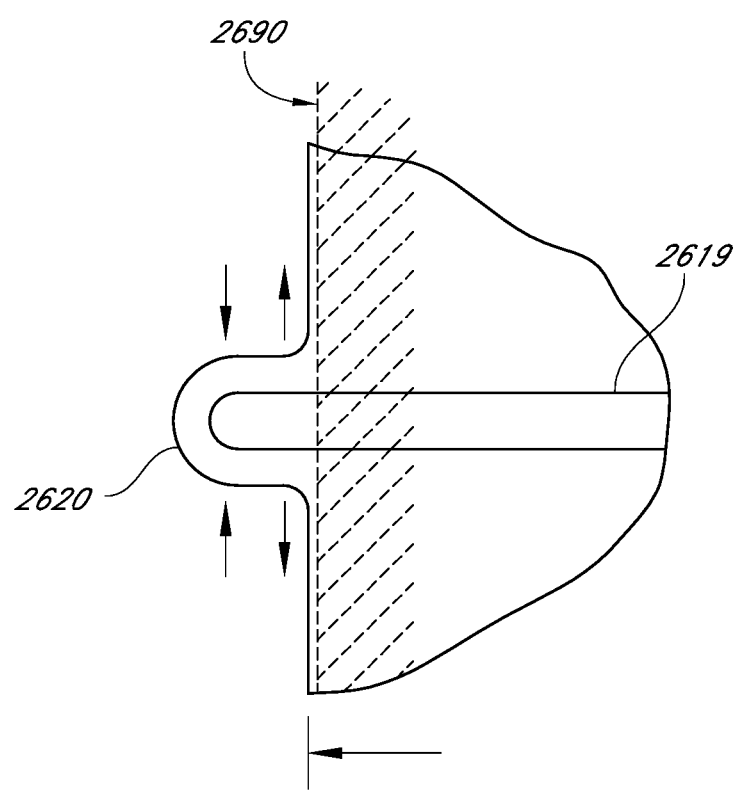
FIG. 26B is an enlarged view of a portion of the lateral bridge of FIG. 26A.
Figure 26C:
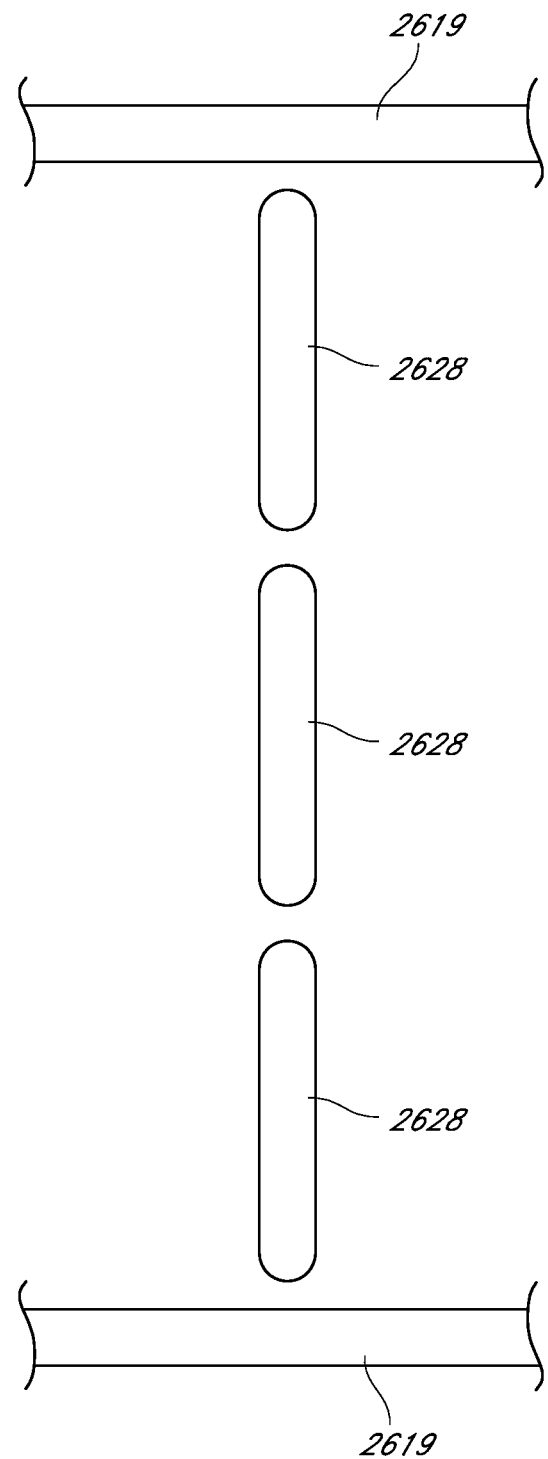
FIG. 26C is an enlarged view of the vertical gap of FIG. 26A.

FIG. 26B illustrates an enlarged view of the edge of the alternative lateral bridging member 2620 of FIG. 26A. As shown, the expansion joint 2619 of the bridging member 2620 can allow the bridging member 2620 to advantageously flex outwardly and inwardly as represented by the arrows. In some embodiments, as illustrated in FIG. 26B, a fin 2690 or other heat transfer member, the polyimide layer and/or other portions of the substrate may not extend as far as the bridging member 2620. As discussed, such bridging members 2620 may be cut or otherwise removed or compromised after the substrate has been properly positioned relative to adjacent thermoelectric devices and heat transfer members. FIG. 26C depicts a partial enlarged view of a portion of the substrate 2610 of FIG. 26A in the vicinity of a vertical gap 2618. The number, size, shape and other characteristics of the fore/aft structural bridges 2628 can be selected according to a particular application.

Figure 27:
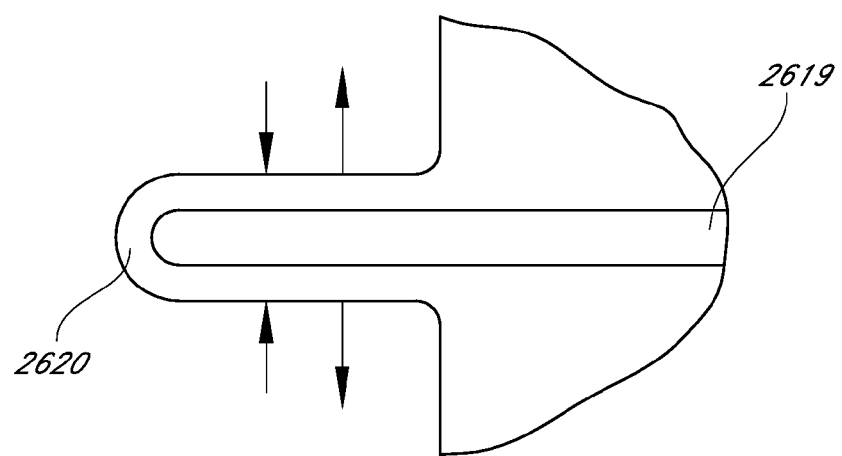
FIG. 27 is a cross-sectional view of a lateral bridge according to another embodiment.

FIG. 27 illustrates a cross-sectional view of a bridge member 2620 that may be included within a thermal conductive layer or member (e.g., copper fin pad) or other member (e.g., substrate) of a thermoelectric device according to any embodiment disclosed herein. As with other embodiments illustrated and discussed herein, the main portion of the bridge member 2620 can comprise copper/polyimide layers. The expansion joint 2619 can include polyimide or another suitable material, as desired or required. Alternatively, it will be appreciated that one or more other materials or combination of materials can be used.

Figure 28:
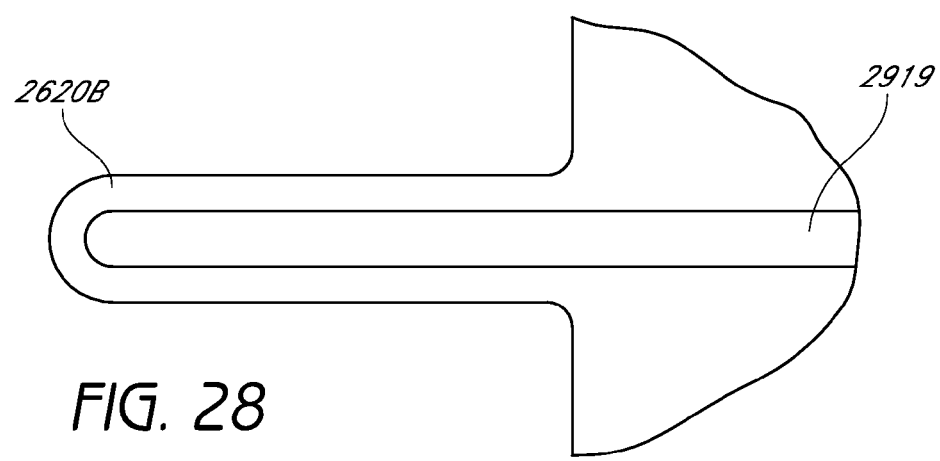
FIG. 28 is a cross-sectional view of a lateral bridge having a long protrusion according to one embodiment.
Figure 29:
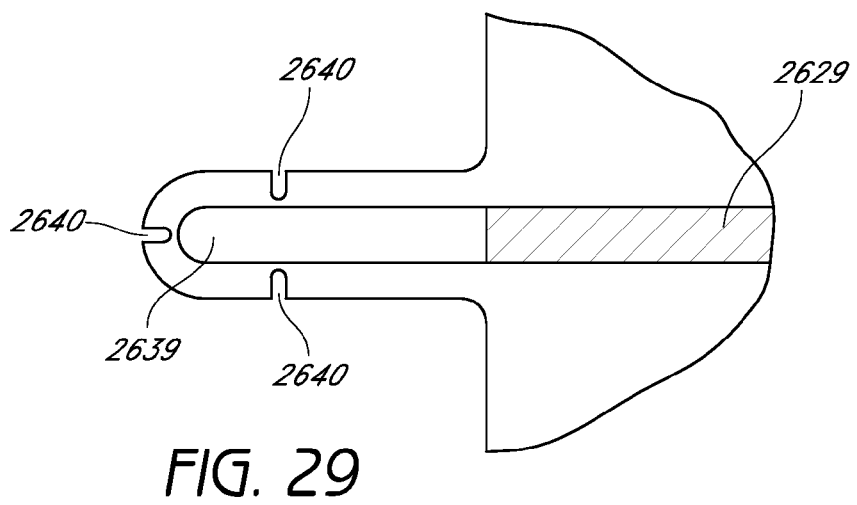
FIG. 29 is a cross-sectional view of a lateral bridge having mini-flex joints according to one embodiment.

FIGS. 28 and 29 illustrate alternative designs for bridge members configured for inclusion within a substrate for a thermoelectric device. In FIG. 28, the bridge member is substantially similar to the bridge member discussed herein with respect to FIG. 27. However, the bridge member in FIG. 28 is generally longer and thinner. It will be appreciated that the shape, size, dimensions, quantity, orientation and other characteristics of the bridge members can be different than illustrated herein.

FIG. 29 illustrates an embodiment of a bridge member having a plurality of mini-flex joints 2640. These mini-flex joints 2640 can further enhance the ability of the substrate to accommodate thermal expansion and/or contraction forces and stresses. With further reference to the embodiments of FIGS. 27 through 29, the gaps 2619 can either be filled (e.g., with polyimide, a sealant, etc.) or unfilled. For example, in FIG. 29, a portion of the gap is filled 2629 while another portion 2639 remains unfilled. In some embodiments, for instance, the filled portion of the gap comprises polyimide and/or the like.

Figure 30:
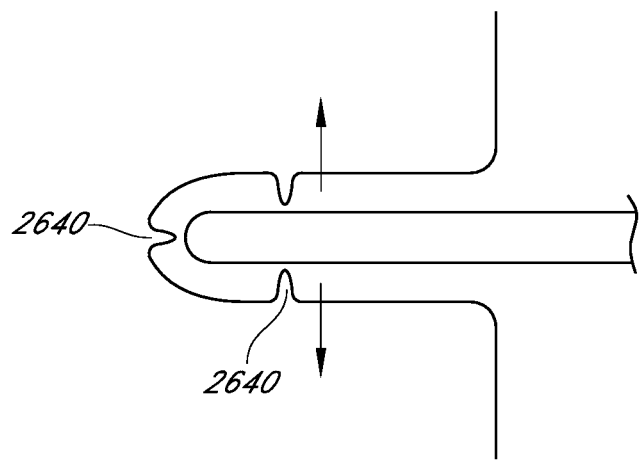
FIG. 30 is a cross-sectional view of the lateral bridge of FIG. 29 having mini-flex joints under expansion.
Figure 31:
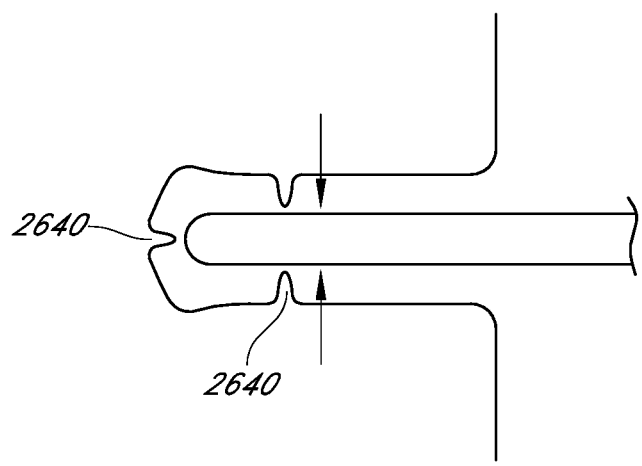
FIG. 31 is a cross-sectional view of the lateral bridge of FIG. 29 having mini-flex joints under contraction.
Figure 32:
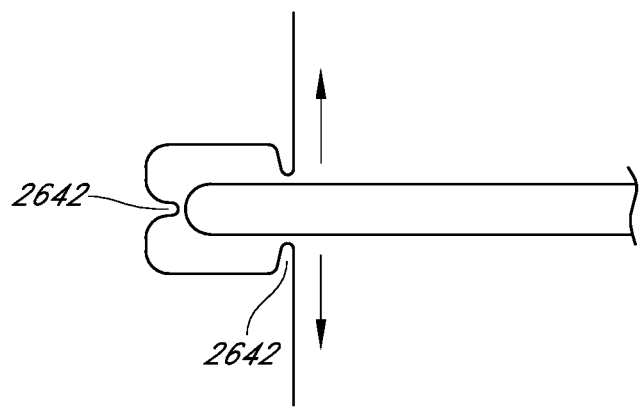
FIG. 32 is a cross-sectional view of a lateral bridge having mini-flex joints according to another embodiment.

FIG. 30 illustrates the embodiment of FIG. 29 with the plurality of mini-flex joints 2640 under expansion. Further, FIG. 31 illustrates the embodiment of FIG. 29 with the plurality of mini-flex joints 2640 under contraction. FIG. 32 illustrates a bridge member having mini-flex joints 2642 according to a different embodiment. As shown, the mini-flex joints 2642 can be aligned along the edge of the thermoelectric device.

Figure 33A:
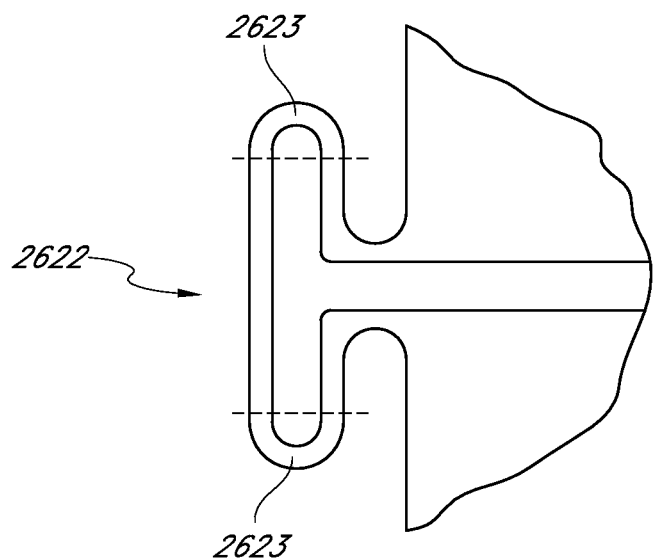
FIG. 33A is a cross-sectional view of a lateral bridge comprising an expansion joint according to another embodiment.
Figure 33B:
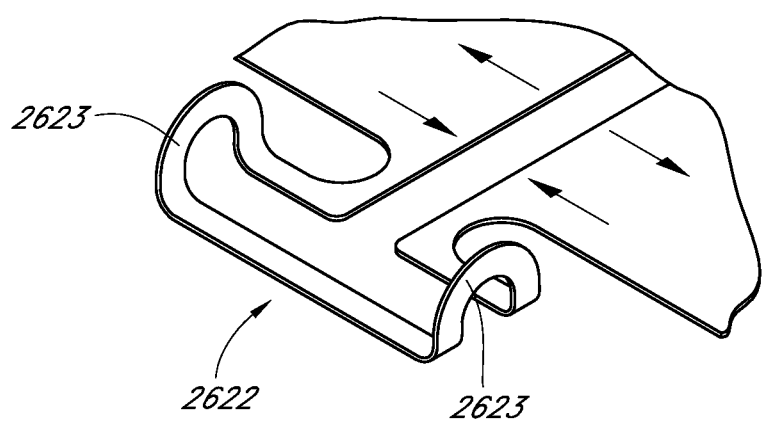
FIG. 33B is a perspective view of the lateral bridge of FIG. 33A.

FIGS. 33A and 33B illustrate views of a bridge member having a different type of expansion joint 2622. As shown, the expansion joints 2622 include extended lobe parts 2623. It will be appreciated that bridge members can be configured differently than illustrated and discussed herein, so as to include more or fewer, or completely different bridge members. Thus, bridge member can include a planar (e.g., two-dimensional shape) or a more intricate (e.g., three-dimensional shape), as desired or required.

Figure 34:
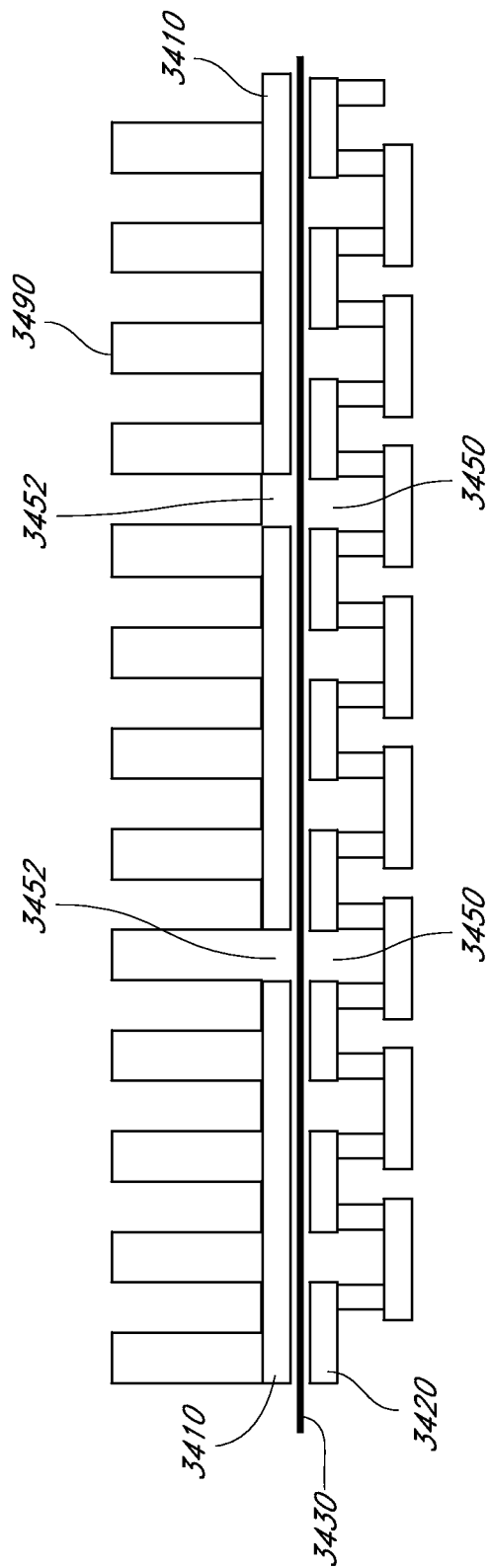
FIG. 34 is a side view of a thermoelectric device having aligned gaps between segments according to one embodiment.

In some embodiments, as illustrated in FIG. 34, the pellet interconnects 3420 are configured to generally align with the gaps 3452 formed in the adjacent substrate 3420. This can further enhance the ability of the thermoelectric device to accommodate thermal expansion and contraction movements. As discussed, it may be advantageous to avoid having a fin member or other heat transfer member straddle over and connect to two adjacent fin pad or other segmented portions of a substrate. Such a design can reduce the ability of the expansion joints to adequately perform their thermal stress reduction function.

Figure 35:
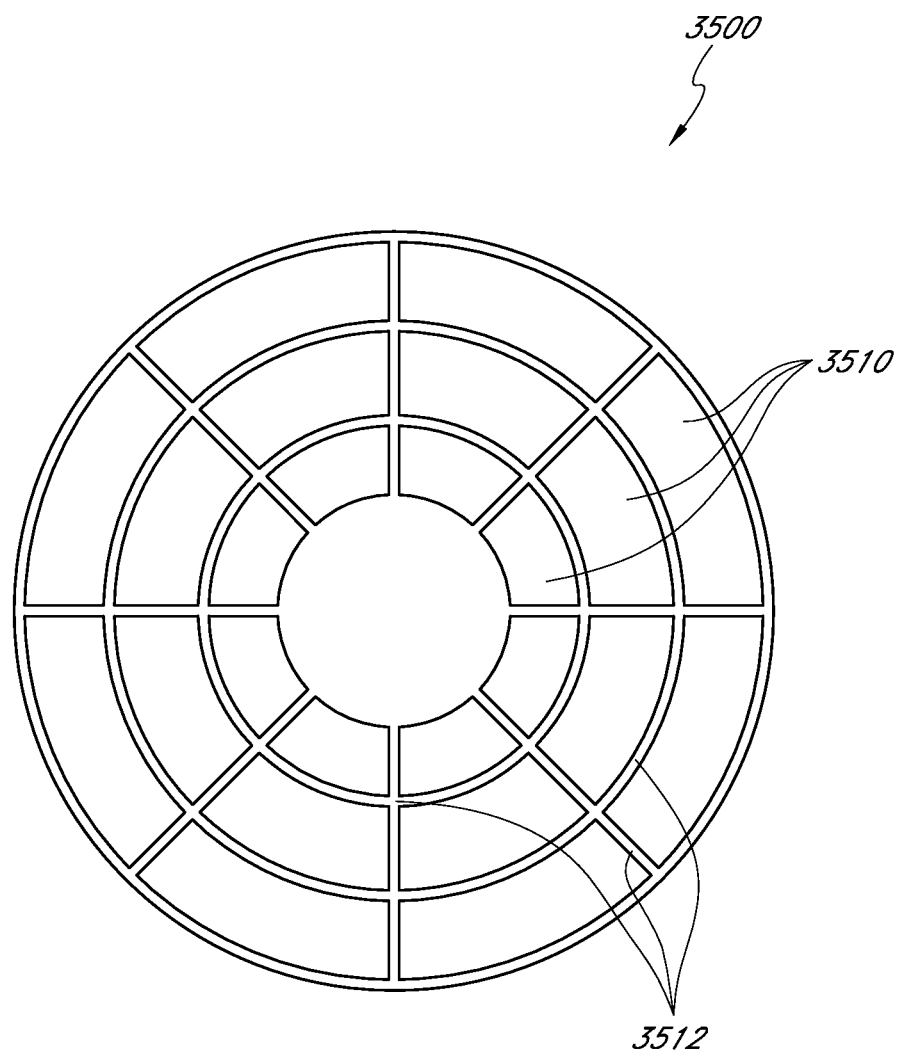
FIG. 35 is a plan view of a circular thermoelectric device having segments along radial and axial directions according to one embodiment.

As illustrated in FIG. 35, a circular thermoelectric device 3500 can include both radial and annular gaps 3512. Thus, as shown in the depicted embodiment, a circular thermoelectric device 3500 can include corresponding segments 3510 that are divided in both the radial and axial directions. Accordingly, such an embodiment can provide enhanced thermal expansion and/or contraction characteristics in both the radial and the axial directions. In addition, thermoelectric devices such as this and others illustrated and discussed herein can advantageously provide thermal isolation in the radial (e.g., flow) direction.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while the number of variations of the invention have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. Accordingly, it should be understood that various features and aspects of the disclosed embodiments can be combined with, or substituted for, one another in order to perform varying modes of the disclosed invention. Thus, it is intended that the scope of the present invention herein disclosed should not be limited by the particular disclosed embodiments described above, but should be determined only by a fair reading of the claims.

What is claimed is:

1. A thermoelectric system comprising:
  a plurality of thermoelectric elements forming a thermoelectric array, the thermoelectric elements having a cooling side and a heating side;
  at least one heat exchanger on at least one of the cooling side and the heating side, the heat exchanger being in thermal communication with at least some of the thermoelectric elements;
  a substrate generally positioned between the thermoelectric elements and the heat exchange element, the substrate comprising:
    a gap-free electrical isolation layer;
    at least one support element configured to receive the at least one heat exchanger; and
    a plurality of interconnecting tabs configured to place adjacent thermoelectric elements in electrical communication with one another;

wherein the substrate is configured to alleviate thermal stress on said substrate when the thermoelectric elements are electrically energized;
wherein portions of the substrate do not include at least one of a support element and an interconnecting tab along the same lateral location of the substrate;
wherein at least some portions of the substrate do not include a support element and an interconnecting tab, wherein such portions of the substrate that do not include a support element and an interconnecting tab are at least partially laterally aligned along at least one gap;
wherein the substrate comprises at least one bridge configured to connect at least two adjacent support segments positioned on either side of the at least one gap;
wherein the at least one support element comprises at least two support segments, wherein the at least one support element is provided in the substrate as a unitary member such that the at least two support segments are connected by the at least one bridge;
wherein the electrical isolation layer of said substrate is positioned between the at least one support element and the plurality of interconnecting tabs, said electrical isolation layer comprising a film that comprises a continuous, unitary structure that extends across the at least one gap and across spaces formed between adjacent interconnecting tabs; and
wherein the at least one bridge is integrally formed and substantially planar with the at least one support element and extends past an edge of the at least one support element.

2. The system of claim 1, wherein the bridge is configured to be selectively removed once the substrate is secured to the heat exchanger and the thermoelectric elements.

3. The system of claim 1, wherein the bridge is configured to hold at least two of the at least two support elements in place during soldering or assembling and to accommodate thermal stress.

4. The system of claim 1, wherein the electrical isolation layer comprises polyimide.

5. The system of claim 1, wherein the electrical isolation layer comprises ceramic.

6. The system of claim 1, wherein the at least one support element comprises copper.

7. The system of claim 1, wherein the heat exchanger is configured to extend across at least one gap.

8. The system of claim 1, wherein the heat exchanger is configured to not extend across at least one gap.

9. The system of claim 1, further comprising a sealant positioned within the at least one gap, the sealant being configured to protect the thermoelectric elements.

10. A thermoelectric assembly comprising:
a plurality of thermoelectric elements forming a thermoelectric array, the thermoelectric elements having a cooling side and a heating side;
fins located on at least one of the cooling side and the heating side, the fins being in thermal communication with at least some of the thermoelectric elements;
a substrate generally positioned between the thermoelectric elements and the fins, the substrate comprising:
a gap-free electrical isolation layer; and
at least one support element configured to receive at least one of the fins;
wherein the substrate is configured to reduce thermal stress on said substrate;
wherein the substrate comprises at least one portion that does not include the at least one support element and an interconnecting tab, the interconnecting tab being configured to electrically couple two adjacent thermoelectric elements;
at least one gap defined in portions of the substrate that do not include at least one support element and the interconnecting tab along the same lateral location;
wherein the electrical isolation layer comprises a unitary structure and is generally continuous such that said electrical isolation layer extends across the at least one gap;
wherein the substrate comprises at least one interconnecting bridge;
wherein the at least one support element comprises at least two support segments, wherein the at least one support element is provided in the substrate as a unitary member such that the at least two support segments are connected by the at least one interconnecting bridge, wherein the at least one interconnecting bridge is configured to connect adjacent support elements of the at least one support element;
wherein the electrical isolation layer is positioned generally between the at least one support element and the plurality of thermoelectric elements; and
wherein the at least one interconnecting bridge is integrally formed and substantially planar with the adjacent support elements and extends past an edge of the adjacent support elements.

11. The assembly of claim 10, wherein the at least one interconnecting bridge is configured to be selectively removed once the substrate is secured to the fins and the thermoelectric elements.

12. The assembly of claim 10, wherein the electrical isolation layer comprises polyimide.

13. A method of manufacturing a thermoelectric assembly, comprising:
attaching a plurality of thermoelectric elements to a substrate having at least one gap, the substrate comprising:
a gap-free electrical isolation layer comprising a film that extends continuously along an entire substrate, including extending across the at least one gap;
at least one support element configured to receive at least one heat exchanger, the at least one support element comprising at least two support segments;
wherein the at least one gap separates the at least two support segments, the at least one gap being at least partially aligned laterally with a spacing between at least two interconnecting tabs that electrically couple adjacent thermoelectric elements; and
at least one bridge connecting adjacent segments of the support element across the at least one gap, said at least one bridge at least partially originating from and at least partially forming a unitary structure with said adjacent segments of the support element;
positioning the at least one support element and the at least one bridge as a unitary structure adjacent the gap-free electrical isolation layer;
attaching the at least one heat exchanger to the substrate;
wherein the at least one bridge is configured to either remain on the substrate or be removed from the substrate after the substrate has been secured to at least some of the plurality of the thermoelectric elements and the at least one heat exchanger; and
wherein the electrical isolation layer is positioned generally between the at least one support element and the plurality of thermoelectric elements; and
at least partially removing at least one bridge from the substrate or cutting at least one bridge when the substrate has been secured to at least one of the plurality of thermoelectric elements and the at least one heat exchanger.

14. The method of claim 13, further comprising positioning a housing at least partially around the assembly.

15. A method of manufacturing a thermoelectric assembly, comprising:

attaching a plurality of thermoelectric elements to a substrate having at least one gap, the substrate comprising:
- at least one support element configured to receive at least one heat exchanger, the at least one support element comprising at least two support segments, wherein the at least one gap separates the at least two support segments; and
- at least one bridge connecting the at least two adjacent segments of the at least one support element across the at least one gap, said at least one bridge at least partially forming a unitary structure with the adjacent segments of the support element; and
- an electrical isolation layer positioned between the at least one support element and the thermoelectric elements;

positioning the at least one support element and the at least one bridge as a unitary structure adjacent the electrical isolation layer;

attaching at least one heat exchanger to the at least one support substrate;

wherein the at least one gap is at least partially laterally aligned with a spacing between interconnecting members that electrically couple adjacent thermoelectric elements;

wherein the at least one bridge is configured to either remain on the substrate or be removed from the substrate after the substrate has been secured to at least some of the plurality of the thermoelectric elements and the at least one heat exchanger; and at least partially removing at least one bridge from the at least two adjacent segments of the at least one support element of the substrate or cutting at least one bridge from the at least two adjacent segments of the at least one support element of the substrate when the substrate has been secured to at least one of the plurality of thermoelectric elements and the at least one heat exchanger.

* * * * *